(12) United States Patent
Forbes

(10) Patent No.: US 7,045,874 B2
(45) Date of Patent: May 16, 2006

(54) MICROMECHANICAL STRAINED SEMICONDUCTOR BY WAFER BONDING

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,580

(22) Filed: Aug. 31, 2004

(65) Prior Publication Data

US 2005/0032296 A1  Feb. 10, 2005

Related U.S. Application Data

(62) Division of application No. 10/431,137, filed on May 7, 2003.

(51) Int. Cl.
*H01L 29/06* (2006.01)

(52) U.S. Cl. ........................ 257/510; 257/622

(58) Field of Classification Search ............. 257/347, 257/509, 510, 618, 622, 623, 626
See application file for complete search history.

(56) References Cited

U.S. PATENT DOCUMENTS

| | | | |
|---|---|---|---|
| 4,523,975 A | 6/1985 | Groves et al. | |
| 5,234,535 A | 8/1993 | Beyer et al. | |
| 5,343,064 A | 8/1994 | Spangler et al. | |
| 5,441,591 A | 8/1995 | Imthurn et al. | |
| 5,443,661 A * | 8/1995 | Oguro et al. | 148/33.5 |
| 5,461,243 A | 10/1995 | Ek et al. | |
| 5,482,869 A * | 1/1996 | Kohyama | 438/476 |
| 5,661,044 A | 8/1997 | Holland et al. | |
| 5,673,223 A * | 9/1997 | Park | 365/185.17 |
| 5,691,230 A | 11/1997 | Forbes | |
| 5,759,898 A | 6/1998 | Ek et al. | |
| 5,854,501 A * | 12/1998 | Kao | 257/316 |
| 5,858,819 A | 1/1999 | Miyasaka | |
| 5,877,070 A | 3/1999 | Goesele et al. | |
| 5,879,996 A | 3/1999 | Forbes | |
| 5,949,102 A | 9/1999 | Saida et al. | |

(Continued)

FOREIGN PATENT DOCUMENTS

JP  54-152464 A  11/1979

(Continued)

OTHER PUBLICATIONS

"Cornell Demonstrates a Universal Substrate", *Compound Semiconductor*, 3(2), (Mar./Apr. 1997), 27-29.

(Continued)

*Primary Examiner*—Wael Fahmy
*Assistant Examiner*—Pamela E Perkins
(74) *Attorney, Agent, or Firm*—Schwegmen, Lundberg, Woessner & Kluth, P.A.

(57) ABSTRACT

One aspect disclosed herein relates to a method for forming a strained semiconductor structure. In various embodiments of the method, a number of recesses are formed in a surface of a first semiconductor wafer such that the surface of the first semiconductor wafer has a number of raised areas and a number of recessed areas. A surface of a second semiconductor wafer is bonded to the raised areas of the first semiconductor wafer in an environment having a first pressure. The surface of the second semiconductor wafer is bonded to the recessed areas of the first semiconductor wafer in an environment having a second pressure. The second pressure is greater than the first pressure to influence the second semiconductor wafer into contact with the first semiconductor wafer in the recesses in the surface of the first semiconductor wafer. Other aspects are provided herein.

37 Claims, 15 Drawing Sheets

U.S. PATENT DOCUMENTS

| | | | |
|---|---|---|---|
| 5,963,817 | A | 10/1999 | Chu et al. |
| 6,049,106 | A | 4/2000 | Forbes |
| 6,093,623 | A | 7/2000 | Forbes |
| 6,096,433 | A | 8/2000 | Kikuchi et al. |
| 6,103,598 | A | 8/2000 | Yamagata et al. |
| 6,110,793 | A | 8/2000 | Lee et al. |
| 6,136,666 | A | 10/2000 | So |
| 6,143,628 | A | 11/2000 | Sato et al. |
| 6,174,784 | B1 | 1/2001 | Forbes |
| 6,180,487 | B1 | 1/2001 | Lin |
| 6,204,145 | B1 | 3/2001 | Noble |
| 6,228,694 | B1* | 5/2001 | Doyle et al. ............... 438/199 |
| 6,251,751 | B1 | 6/2001 | Chu et al. |
| 6,261,876 | B1 | 7/2001 | Crowder et al. |
| 6,274,457 | B1 | 8/2001 | Sakai et al. |
| 6,274,460 | B1* | 8/2001 | Delgado et al. ........... 438/476 |
| 6,309,950 | B1 | 10/2001 | Forbes |
| 6,328,796 | B1 | 12/2001 | Kub et al. |
| 6,377,070 | B1 | 4/2002 | Forbes |
| 6,413,827 | B1 | 7/2002 | Farrar |
| 6,423,613 | B1 | 7/2002 | Geusic |
| 6,424,001 | B1 | 7/2002 | Forbes et al. |
| 6,448,601 | B1 | 9/2002 | Forbes et al. |
| 6,455,397 | B1 | 9/2002 | Belford |
| 6,461,933 | B1 | 10/2002 | Houston |
| 6,476,434 | B1 | 11/2002 | Noble et al. |
| 6,486,008 | B1 | 11/2002 | Lee |
| 6,496,034 | B1 | 12/2002 | Forbes et al. |
| 6,514,836 | B1 | 2/2003 | Belford |
| 6,515,335 | B1 | 2/2003 | Christiansen et al. |
| 6,531,727 | B1 | 3/2003 | Forbes et al. |
| 6,538,330 | B1 | 3/2003 | Forbes |
| 6,541,356 | B1 | 4/2003 | Fogel et al. |
| 6,559,491 | B1 | 5/2003 | Forbes et al. |
| 6,566,682 | B1 | 5/2003 | Forbes |
| 6,582,512 | B1 | 6/2003 | Geusic et al. |
| 6,583,052 | B1 | 6/2003 | Shin |
| 6,583,437 | B1 | 6/2003 | Mizuno et al. |
| 6,593,625 | B1 | 7/2003 | Christiansen et al. |
| 6,597,203 | B1 | 7/2003 | Forbes |
| 6,620,683 | B1 | 9/2003 | Lin et al. |
| 6,630,713 | B1 | 10/2003 | Geusic |
| 6,649,476 | B1 | 11/2003 | Forbes |
| 6,649,492 | B1 | 11/2003 | Chu et al. |
| 6,689,671 | B1 | 2/2004 | Yu et al. |
| 6,703,293 | B1 | 3/2004 | Tweet et al. |
| 6,703,648 | B1 | 3/2004 | Xiang et al. |
| 6,717,216 | B1 | 4/2004 | Doris et al. |
| 6,740,913 | B1 | 5/2004 | Doyle et al. |
| 6,812,508 | B1* | 11/2004 | Fukumi ..................... 257/244 |
| 2002/0001965 | A1 | 1/2002 | Forbes |
| 2002/0135020 | A1 | 9/2002 | Skotnicki et al. |
| 2002/0185686 | A1 | 12/2002 | Christiansen et al. |
| 2003/0013323 | A1 | 1/2003 | Hammond et al. |
| 2003/0201468 | A1 | 10/2003 | Christiansen et al. |
| 2003/0218189 | A1 | 11/2003 | Christiansen et al. |
| 2003/0227072 | A1 | 12/2003 | Forbes |
| 2004/0171196 | A1 | 9/2004 | Walitzki |
| 2004/0173798 | A1 | 9/2004 | Forbes |
| 2004/0214366 | A1 | 10/2004 | Segal et al. |
| 2004/0217352 | A1 | 11/2004 | Forbes |
| 2004/0217391 | A1 | 11/2004 | Forbes |
| 2004/0224480 | A1 | 11/2004 | Forbes |
| 2004/0232422 | A1 | 11/2004 | Forbes |
| 2004/0232487 | A1 | 11/2004 | Forbes |
| 2004/0232488 | A1 | 11/2004 | Forbes |
| 2004/0235264 | A1 | 11/2004 | Forbes |
| 2005/0020094 | A1 | 1/2005 | Forbes et al. |
| 2005/0023529 | A1 | 2/2005 | Forbes |
| 2005/0023612 | A1 | 2/2005 | Forbes |
| 2005/0023616 | A1 | 2/2005 | Forbes |
| 2005/0029619 | A1 | 2/2005 | Forbes |
| 2005/0087842 | A1 | 4/2005 | Forbes |

FOREIGN PATENT DOCUMENTS

| | | |
|---|---|---|
| JP | 54-155770 A | 12/1979 |
| JP | 2001-093887 | 4/2001 |

OTHER PUBLICATIONS

Abe, T , "Silicon Wafer-Bonding Process Technology for SOI Structures", *Extended Abstracts of the 22nd (1990 International) Conference on Solid State Devices and Materials*, (1990), 853-856.

Auberton-Herve, A J., "SOI: Materials to Systems", *International Electron Devices Meeting, Technical Digest*, (1996), 3-10.

Autumn, Kellar , et al., "Adhesive force of a single gecko foot-hair", *Nature*, 405(6787), (Jun. 2000), 681-685.

Autumn, Kellar , et al., "Evidence for van der Waals adhesion in gecko setae.", *Proceedings of the National Academy of Science U S A.*; 99(19), (Sep. 17, 2002), 12252-6.

Belford, Rona E., et al., "Performance-Augmented CMOS Using Back-End Uniaxial Strain", *IEEE 60th DRC, Conference Digest Device Research Conference*, 2002, (Jun. 24-26, 2002), 41-42.

Berti, M. , "Composition and Structure of Si-Ge Layers Produced by Ion Implantation and Laser Melting", *Journal of Materials Research*, 6(10), (Oct. 1991), 2120-2126.

Berti, M. , "Laser Induced Epitaxial Regrowth of $Si_{1-x}Ge_x$/Si Layers Produced by Ge Ion Implantation", *Applied Surface Science*, 43, (1989), 158-164.

Biever, Celeste , "Secret of 'strained silicon' revealed: behind closed doors, Intel has perfected a novel way to improve chip performance.", *New Scientist*, 180(i2426-2428), (Dec. 20, 2003), 27.

Brown, Chappell, "Bonding twist hints at universal substrate", *EETimes*, (1997), 2 pages.

Bruel, M , "Smart-Cut: a new silicon on insulator material technology based on hydrogen implantation and wafer bonding", *Japanese Journal of Applied Physics, Part 1 (Regular Papers, Short Notes & Review Papers)*, 36(3B), (1997), 1636-1641.

Chen, Xiangdong , et al., "Vertical P-MOSFETs with heterojunction between source/drain and channel", *IEEE Device Research Conference*, (2000), 25-26.

Chilton, B T., et al., "Solid phase epitaxial regrowth of strained $Si_{1-x}Ge_x$/Si strained layer structures amorphized by ion implantation", *Applied Physics Letters*, 54(1), (Jan. 2, 1989), 42-44.

Clark, Don , et al., "Intel unveils tiny new transistors: Process handles circuits 1/2000th the width of a human hair", *The Wall Street Journal*, (Aug. 13, 2002), 3 pages.

Clifton, P.A., et al., "A process for strained silicon n-channel HMOSFETs", *ESSDERC'96. Proceedings of the 26th European Solid State Device Research Conference*, (Sep. 1996), 519-22.

Dharmatilleke, S N., et al., "Anodic Bonding of Glass to Glass and Silicon to Glass or Silicon to Silicon Through a Very Thick Thermally Grown SiO2 Layer", *Proceedings of IS 3M International Symposium on Smart Structures and Microsystems*, http://dolphin.eng.uc.edu/projects/bonding/paper.pdf, (2000), 32.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998), 13-17.

Fischetti, M V., et al., "Band structure, deformation potentials, and carrier mobility in strained Si, Ge, and SiGe alloys", *Journal of Applied Physics*, 80(4), (Aug. 15, 1996), 2234-2252.

Fournel, F , et al., "Ultra High Precision Of The Tilt/Twist Misorientation Angles In Silicon/Silicon Direct Wafer Bonding", *Abstract—Electronic Materials Conference*, (Jun. 2002), 9.

Garcia, G A., et al., "High-quality CMOS in thin (100 nm) silicon on sapphire", *IEEE Electron Device Letters*, 9(1), (Jan. 1988), 32-34.

Harendt, Christine , "Silicon on Insulator Material by Wafer Bonding", *Journal of Electronic Materials*, 20(3), (Mar. 1991), 267-77.

Imthurn, George P., et al., "Bonded Silicon-on-Sapphire Wafers and Devices", *Journal of Applied Physics*, 72(6), (Sep. 1992), 2526-7.

Iyer, S S., "Separation by Plasma Implantation of Oxygen (SPIMOX) operational phase space", *IEEE Trans. on Plasma Science, 25*, (1997), 1128-1135.

Jurczak, M , "SON (silicon on nothing)-a new device architecture for the ULSI era", *VLSI Technology, 1999. Digest of Technical Papers. 1999 Symposium on*, Jun. 14-16, 1999, 29-30.

Kalavade, Pranav , et al., "A novel sub-10 nm transistor", *58th DRC. Device Research Conference. Conference Digest*, (Jun. 19-21, 2000), 71-72.

Kostrzewa, M , et al., "Testing the Feasibility of strain relaxed InAsP and InGaAs compliant substrates", *EMC 2003 International Conference Indium Phosphide and Related Materials. Conference Proceedings*, (Jun. 2003), 8.

Lasky, J. B., "Wafer Bonding for Silicon-on-Insulator Technologies", *Applied Physics Letters*, 48(1), (Jan. 6, 1986), 78-80.

Lu, D, , "Bonding Silicon Wafers by Use of Electrostatic Fields Followed by Rapid Thermal Heating", *Materials Letters*, 4(11), (Oct. 1986), 461-464.

Lu, X. , et al., "SiGe and SiGeC Surface Alloy Formation Using High-Dose Implantation and Solid Phase Epitaxy", *Proceedings of the 11th International Conference on Ion Implantation Technology*, Austin, TX,(1997), 686-689.

Mizuno, T , et al., "Advanced SOI-MOSFETs with Strained-Si Channel for High Speed CMOS Electron/Hole Mobility Enhancement", *2000 Symposium on VLSI Technology. Digest of Technical Papers*, (2000), 210-211.

Mizushima, I. , "Empty-space-in-silicon technique for fabricating a silicon-on-nothing structure", *Applied Physics Letters*, 77(20), American Institute of Physics, NY,(Nov. 13, 2000), 3290-3292.

Moran, Peter, "Strain Relaxation in Wafer-Bonded SiGe/Si Heterostructures Due to Viscous Flow of an Underlying Borosilicate Glass", *Electronic Materials Conference, Santa Barbara, Jun. 2002, Abstract*, pp. 8-9.

Mumola, P. B., et al., "Recent advances in thinning of bonded SOI wafers by plasma assisted chemical etching", *Proceedings of the third International Symposium on Semiconductor Wafer Bonding: Physics and Applications*, (1995) 28-32.

Nayak, D.K. , "High performance GeSi Quantum-well PMOS on SIMOX", *International Electron Devices Meeting 1992. Technical Digest*, (1992), 777-80.

Nichols, F A., "Surface-(inteface) and volume-diffusion contributions to morphological changes driven by capillarity", *Transactions of the American Institute of Mining, Metallurgical and Petroleum Engineers*, 233(10), (1965), 1840-8.

O'Neill, A G., et al., "High speed deep sub-micron MOSFET using high mobility strained silicon channel", *ESSDERC '95. Proceedings of the 25th European Solid State Device Research Conference*, (Sep. 1995), 109-12.

Omi, Hiroo , et al., "Semiconductor Surface with Strain Control", http://www.brl.ntt.co.ip/J/kouhou/katsudou/report100/E/report04_e.html.

Ouyang, Q , et al., "Bandgap Engineering in Deep Submicron Vertical pMOSFETs", *IEEE 58th DRC. Device Research Conference. Conference Digest*, (2000), 27-28.

Paine, D. C., "The Growth of Strained Si-xGex Alloys on (100) Silicon Using Solid Phase Epitaxy", *Journal of Materials Research*, 5(5), (May 1990), 1023-1031.

People, R. , "Calculation of critical layer thickness versus lattice mismatch for GexSi1-x/Si strained-layer heterostructures", *Applied Physics Letters*, 47(3), (Aug. 1, 1985), 322-4.

Rim, Kern , et al., "Fabrication and analysis of deep submicron strained-Si n-MOSFET's", *IEEE Transactions on Electron Devices*, 47(7), (Jul. 2000), 1406-1415.

Rim, Kern , et al., "Strained Si NMOSFETs for High Performance CMOS Technology", *2001 Symposium on VLSI Technology. Digest of Technical Papers*, (2001), 59-60.

Rim, Kern , et al., "Transconductance enhancement in deep submicron strained Si n-MOSFETs", *International Electron Devices Meeting 1998. Technical Digest*, (1998), 707-710.

Sugiyama, N , et al., "Formation of strained-silicon layer on thin relaxed-SiGe/SiO/sub 2//Si structure using SIMOX technology", *Thin Solid Films*, 369(1-2), (Jul. 2000), 199-202.

Suni, T , et al., "Effects of Plasma Activation on Hydrophilic Bonding of Si and SiO2", *Journal of the Electrochemical Society*, 149, (2002), G348-51.

Takagi, Shin-Ichi , "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002), 37-40.

Verdonckt-Vandebroek,, Sophie , et al., "SiGe-Channel Heterojunction p-MOSFET's", *IEEE Transactions on Electron Devices*, 41(1), (Jan. 1994), 90-101.

Welser, J , et al., "Strain dependence of the performance enhancement in strained-Si n-MOSFETs", *IEEE International Electron Devices Meeting 1994. Technical Digest*, (Dec. 11-14, 1994), 373-376.

Wijaranakula, W. , et al., "Oxygen precipitation in p/p+(100) epitaxial silicon material", *Journal of the Electrochemical Society*, 134(9), SEH America, Inc., Mater. Characterization Lab., Vancouver, WA,(Sep. 1987), 2310-16.

Wild, M. , "Laser Assisted Bonding of Silicon and Glass in Micro-System Technology", http://www.ilt.fhg.de/eng/jb00-s42.html, Fraunhofer ILT—jb00-s42, (2003), 1.

Xuan, Peiqi , et al., "60nm Planarized Ultra-thin Body Solid Phase Epitaxy MOSFETs", *IEEE Device Research Conference, Conference Digest. 58th DRC*, (Jun. 19-21, 2000), 67-68.

Yin, Haizhou , "High Ge-Content Relaxed Si1-xGex Layers by Relaxation on Complaint Substrate with Controlled Oxidation", *Electronic Materials Conference, Santa Barbara*, Jun. 2002, 8.

Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996), 31.

Zhu, Z H., et al., "Wafer bonding technology and its applications in optoelectronic devices and materials", *IEEE Journal of Selected Topics in Quantum Electronics*, (Jun. 1997), 927-936.

Kal, S. , et al., "Strained Silicon-SiGe Devices Using Germanium Implantation", *IETE Journal of Research*, 43 (2-3), (Mar. 1997), 185-192.

Xiao, Q. , et al., "Preparation of thin Strained Si Film by Low Temperature Ge Ion Implantation and High Temperature Annealing", *Solid-State and Integrated Circuits Technology, 2004. Proceedings 7th Int'l Conf.*, 3(3), (Oct. 18, 2004),2163-2166.

* cited by examiner

MICROMECHANICAL STRAINED SEMICONDUCTOR BY WAFER BONDING

CROSS REFERENCE TO RELATED APPLICATIONS

This application is a divisional under 37 C.F.R. 1.53(b) of U.S. application Ser. No. 10/431,137, filed on May 7, 2003, which application is incorporated herein by reference.

This application is related to the following commonly assigned U.S. patent applications which are herein incorporated by reference in their entirety:

"Output Prediction Logic Circuits With Ultra-Thin Vertical Transistors and Methods of Formation," U.S. application Ser. No. 10/164,611, filed on Jun. 10, 2002;

"Micro-Mechanically Strained Semiconductor Film," U.S. application Ser. No. 10/379,749, filed on Mar. 5, 2003;

"Localized Strained Semiconductor on Insulator," U.S. application Ser. No. 10/425,797, filed on Apr. 29, 2003;

"Strained Si/SiGe Layer Structures By Ion Implantation," U.S. application Ser. No. 10/431,134, filed on May 7, 2003; and "Micromechanical Strained Semiconductor By Wafer Bonding," U.S. application Ser. No. 10/425,484, filed on Apr. 29, 2003.

TECHNICAL FIELD

This disclosure relates generally to semiconductor devices, and more particularly, to devices formed with strained semiconductor films.

BACKGROUND

The semiconductor industry continues to strive for improvements in the speed and performance of semiconductor devices. Strained silicon technology enhances carrier mobility in both n-channel and p-channel devices, and thus improves device speed and performance.

One technique for producing strained silicon involves growing silicon on relaxed silicon germanium (Si/SiGe) structures. There is a large mismatch in the cell structure between the Si and SiGe layers. This mismatch causes a pseudomorphic layer of Si on relaxed SiGe to be under a biaxial tensile strain that modifies the band structure and enhances carrier transport in the Si layer. In an electron inversion layer, the subband splitting is larger in strained Si because of the strain-induced band splitting in addition to that provided by quantum confinement. For example, the ground level splitting $(E_0(d_4)-E_0(d_2))$ in a MOS inversion layer at 1 MV/cm transverse field is ~120 meV for unstrained Si and ~250 meV for strained Si. The increase in energy splitting reduces inter-valley scattering and enhances NMOSFET mobility, as demonstrated at low (<0.6 MV/cm) and higher (~1MV/cm) vertical fields. The scaled transconductance $(g_m)$ is also improved due to the reduced density of states and enhanced non-equilibrium transport.

One method for forming the Si/SiGe layer involves epitaxially growing the Si and SiGe layers using an ultra-high vacuum chemical vapor deposition (UHVCVD) process. The UHVCVD process is a costly and complex process. The Ge content is graded in steps to form a fully relaxed SiGe buffer layer before a thin (~20 nm) strained Si channel layer is grown. X-ray diffraction analysis can be used to quantify the Ge content and strain relaxation in the SiGe layer. The strain state of the Si channel layer can be confirmed by Raman spectroscopy. One proposed back end approach for straining silicon applies uniaxial strain to wafers/dies after the integrated circuit process is complete. The dies are thinned to membrane dimensions and then affixed to curved substrates to apply an in-plane, tensile strain after device manufacture.

Research indicates that uniaxial strained silicon has advantages over biaxial strained silicon. Less strain is required to obtain an improvement factor if the silicon is strained uniaxially rather than biaxially. Uniaxial strained silicon reduces contact potentials, alters the work function, and reduces band gap and in-plane effective mass to improve conduction.

There is a need in the art to provide improved strained semiconductor films and devices that incorporate the strained films, and to provide improved methods for forming strained semiconductor films.

SUMMARY

The above mentioned problems are addressed and will be understood by reading and studying this specification. Various aspects of the present invention relate to strained semiconductor films, methods of forming the strained semiconductor films, and methods of forming structures and devices that include strained semiconductor films. Disclosed herein is a relatively simple and low cost wafer bonding technique to produce strained semiconductor layers using conventional bonded wafer techniques.

One aspect disclosed herein relates to a method for forming a strained semiconductor structure. In various embodiments of the method, a number of recesses are formed in a surface of a first semiconductor wafer such that the surface of the first semiconductor wafer has a number of raised areas and a number of recessed areas. A surface of a second semiconductor wafer is bonded to the raised areas of the first semiconductor wafer in an environment having a first pressure. The surface of the second semiconductor wafer is bonded to the recessed areas of the first semiconductor wafer in an environment having a second pressure. The second pressure is greater than the first pressure to influence the second semiconductor wafer into contact with the first semiconductor wafer in the recesses in the surface of the first semiconductor wafer.

In various embodiments of the method, a number of recesses are formed in a surface of a first semiconductor wafer such that the surface of the first semiconductor wafer has a number of raised areas and a number of recessed areas. A second semiconductor wafer is defined in a surface layer of a sacrificial crystalline semiconductor wafer. The surface layer of the sacrificial semiconductor wafer is bonded to the raised areas of the first semiconductor wafer in an environment having a first pressure. The sacrificial semiconductor wafer is removed from the second semiconductor wafer such that the second semiconductor wafer remains bonded to the first semiconductor wafer. The surface of the second semiconductor wafer is bonded to the first semiconductor wafer in an environment having a second pressure. The second pressure is greater than the first pressure to influence the second semiconductor wafer into contact with the recesses in the surface of the first semiconductor wafer. The second semiconductor wafer and the first semiconductor wafer are heat-treated to further bond the second semiconductor wafer to the first semiconductor wafer.

These and other aspects, embodiments, advantages, and features will become apparent from the following description of the present invention and the referenced drawings.

DETAILED DESCRIPTION

The following detailed description refers to the accompanying drawings which show, by way of illustration, specific aspects and embodiments in which the present invention may be practiced. The various embodiments are not necessarily mutually exclusive as aspects of two or more embodiments can be combined to form other embodiments. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Methods to strain silicon, and structures formed using strained silicon are provided herein. A crystalline semiconductor membrane is bonded to a substrate with recesses such that the membrane is mechanically strained in the recesses of the substrate. The semiconductor layer is sufficiently thin such that it does not plastically deform due to dislocations, yields and/or fractures. One of ordinary skill in the art will understand, upon reading and comprehending this disclosure, that other semiconductor materials can be strained in accordance with embodiments of the present invention.

Figure 1:
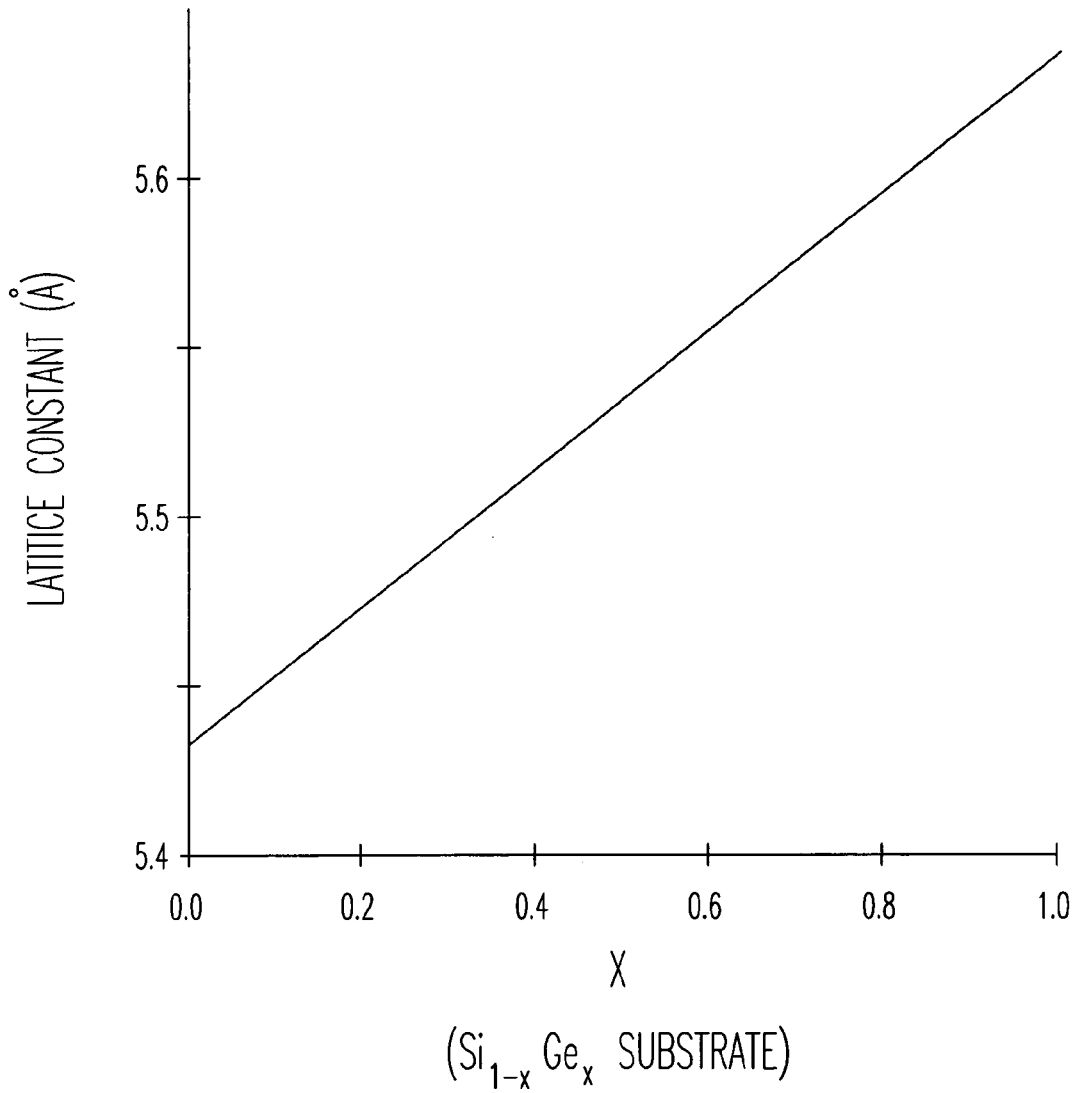
FIG. 1 illustrates the lattice constant of a silicon germanium ($Si_{1-X}Ge_X$) substrate for different percentages (X) of germanium.

According to embodiments provided in this disclosure, silicon is mechanical strained to enhance carrier mobility. Desirable mechanical strain can be determined using research findings for Si/SiGe structures. Si has a lattice constant of 5.43095 Å, and Ge has a lattice constant of 5.64613 Å. The lattice constant of SiGe is between the lattice constant of Si and the lattice constant of Ge, and depends on the percentage of Ge in the SiGe layer. FIG. 1 illustrates the lattice constant of a $Si_{1-X}Ge_X$ substrate for different percentages (X) of Ge. As indicated by FIG. 1, a $Si_{1-X}Ge_X$ substrate containing about 30% Ge (X≈0.3) has a lattice constant of about 5.50 Å. The biaxial strain of the Si on the SiGe can be calculated as follows:

$$\text{Biaxial\_Strain} = \frac{SiGe_{LC} - Si_{LC}}{Si_{LC}} \quad (1)$$

where the subscript LC represents the lattice constant of the SiGe or Si. Thus, as shown in Equation 2, the Si on the SiGe substrate has a biaxial strain of about 1.28%.

$$\text{Biaxial\_Strain} \approx \frac{5.50 - 5.43}{5.43} = 1.28\%. \quad (2)$$

Figure 2:
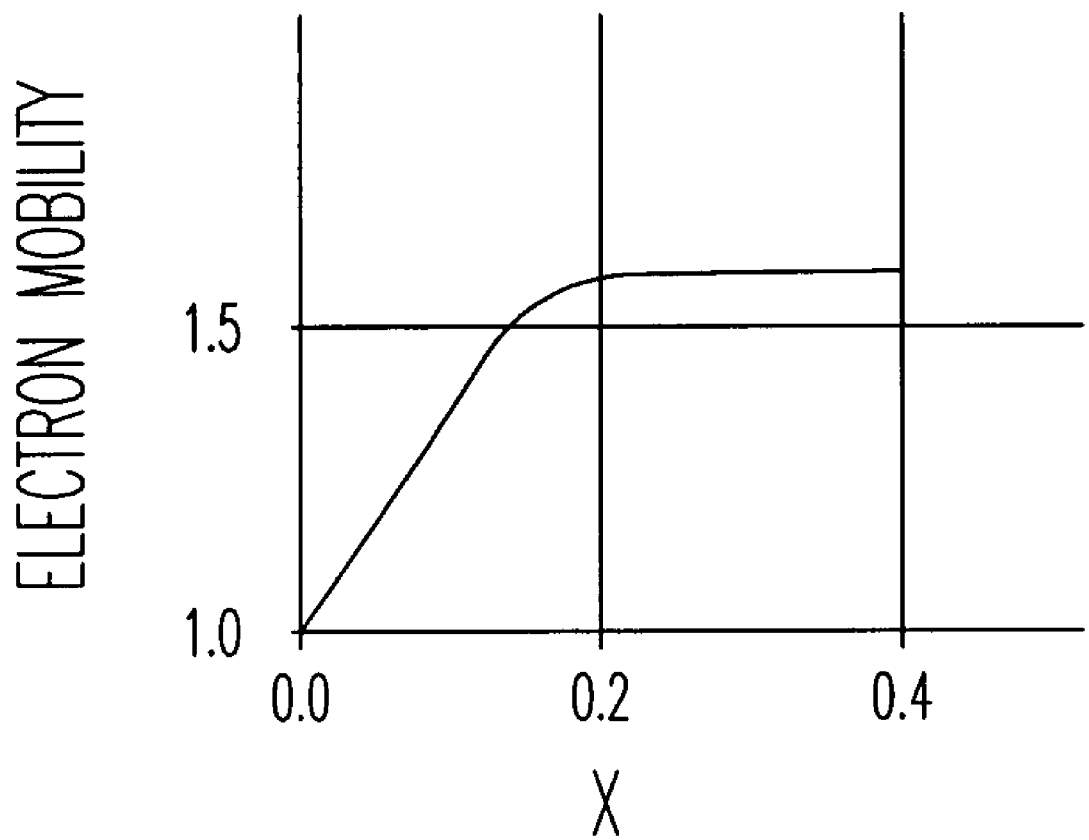
FIG. 2 illustrates the mobility enhancement for strained silicon for different percentages (X) of germanium in a silicon germanium ($Si_{1-X}Ge_X$) substrate.

FIG. 2 illustrates the mobility enhancement for strained Si for different percentages (X) of Ge in a $Si_{1-X}Ge_X$ substrate. The mobility enhancement increases as the percentage of Ge in the $Si_{1-X}Ge_X$ increases, and levels off to around 1.6 when the percentage of Ge is around 22% or larger. Referring to FIG. 1, 22% Ge provides the $Si_{1-X}Ge_X$ substrate with a lattice constant ($SiGe_{LC}$) of around 5.485. Using Equation 1, it is determined that the corresponding strain for 22% Ge (the approximate point where the mobility enhancement levels off) is about 1%.

When the percentage of Ge in the $Si_{1-X}Ge_X$ is about 20% (near the knee of the curve), it can be calculated that the resulting strain is about 0.75%. When the percentage of Ge in the $Si_{1-X}Ge_X$ is about 40%, it can be calculated that the resulting strain is about 1.5%. Referring again to FIG. 1, it can be seen that a $Si_{1-X}Ge_X$ substrate having just under 10% Ge still provides considerable mobility enhancement (1.3). A $Si_{1-X}Ge_X$ substrate having just under 10% Ge provides the $Si_{1-X}Ge_X$ substrate with a lattice constant ($SiGe_{LC}$) of around 5.457. Using Equation 1, it is determined that the corresponding strain is around 0.5%. Thus, it is desirable to achieve a biaxial strain around or greater than 0.5%, and preferably around 1% or greater to obtain the desired enhanced mobility associated with strained Si.

Figure 3:
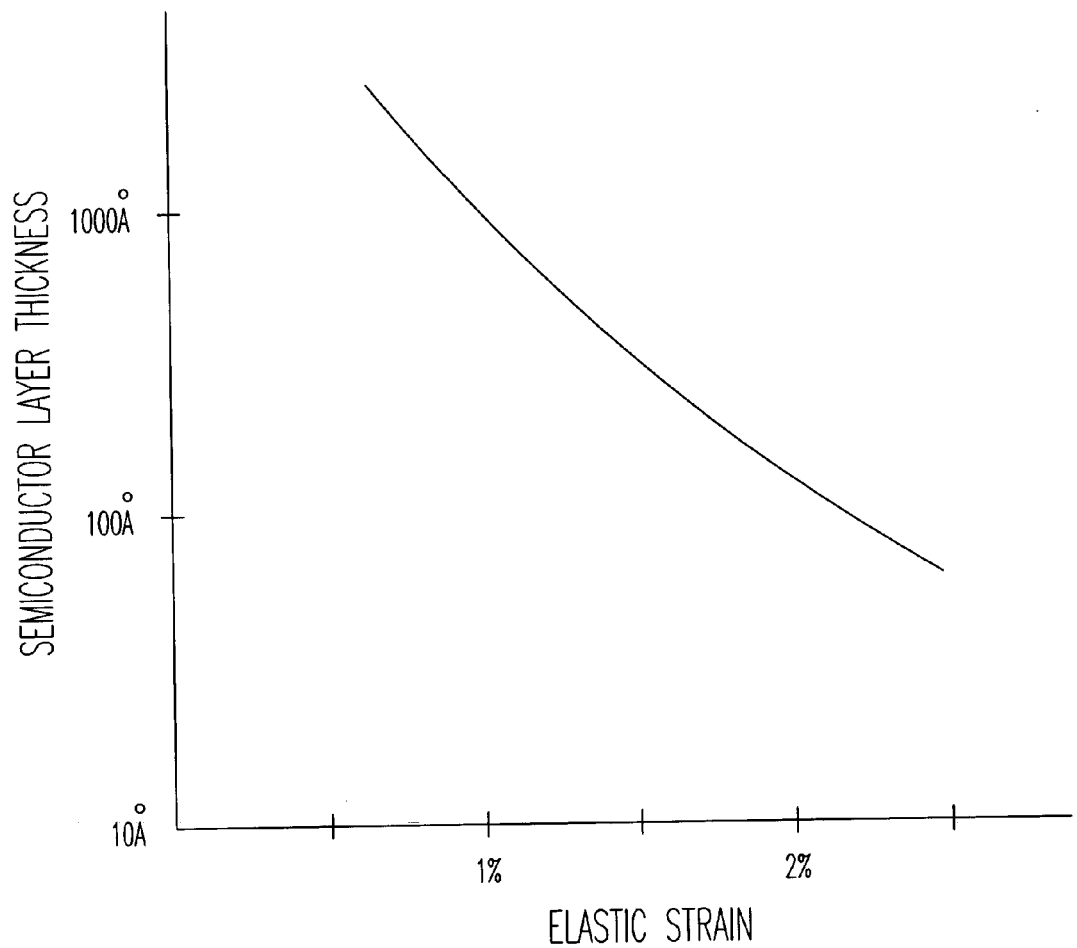
FIG. 3 illustrates a relationship between elastic strain and semiconductor layer thicknesses.

Various embodiments of the present invention mechanically induce a strain in thin semiconductor wafers. FIG. 3 illustrates a relationship between elastic strain and semiconductor layer thicknesses. The semiconductor yield is plotted with respect to plastic deformation and defects in bulk samples. The illustrated values represent the relationship of thin SiGe layers on silicon. FIG. 3 illustrates that thin layers of silicon or other semiconductor materials are more tolerant of strain than thick bulk samples. Previously, thin layers of SiGe have been fabricated on silicon because of the tolerance of the thin layers to strain. FIG. 3 indicates that 1000 Å thin semiconductor layers can be strained up to about 1%, that 100 Å thin semiconductor layers can be strained up to about 2% and thinner semiconductor layers can be strained up to about 2.5%. However, as illustrated earlier with respect to FIG. 2, the mobility enhancement levels off when the strain reaches about 1%.

It is thus desirable to strain a thin semiconductor layer, such as a silicon layer, with a strain greater than 0.5% to achieve significant mobility enhancement. For further mobility enhancement, it is desirable to strain a thin semiconductor wafer, such as an ultra-thin silicon wafer with a thickness within a range of approximately 300 Å to 1000 Å, with a strain within a range of approximately 0.75% to approximately 1.5% where the mobility enhancement levels off. It is also desirable to reduce unnecessary strain and provide a margin for error without unduly affecting the mobility enhancement. Thus, it is desirable to strain a thin semiconductor layer, such as a thin silicon layer, with a strain in the range of approximately 1% to approximately 1.2%.

Ultra-thin wafers, such as single crystalline silicon wafers, have a thickness below approximately 200 microns, which is near the limit of known mechanical thinning techniques. Virginia Semiconductor, Inc. has produced these wafers with a thickness down to about 2 microns with diameters of up to 4 inches. Doping concentrations and profiles for these wafers are comparable to normal thickness wafers, and the Total Thickness Variation (TTV) is generally less than one micron. Bond-quality, ultra-thin wafers are double side polished and have micro-roughness comparable to prime grade, normal thickness wafers. Ultra-thin wafers that have a thickness of approximately 100 microns or more are mechanically similar to normal wafers and can be processed using standard techniques. As the thickness decreases further, the wafer exhibits greater flexibility to the point, at about 20 microns thick, that the wafer can be deformed into a tube, with the wafer contacted flat with the opposite edge. At a thickness less than about 10 microns, ultra-thin wafers become transparent to visible light. The increased flexibility allows ultra-thin wafers to bond to surfaces with roughness orders of magnitude greater than the limit for bonding normal thicknesses.

Recently, a bond cut technique, referred to in literature as a Smart-Cut technique, has been described for producing silicon on insulator wafers for integrated circuits. As will be described in detail below, the bond cut technique implants ions such as hydrogen, bonds two wafer surfaces together, and separates the two bonded wafers along the region of hydrogen implantation. The literature indicates that memory structures have been inverted and stacked capacitors have been buried by wafer bonding. Wafer bonding techniques are well known. Various techniques such as grinding, polishing, chemical etch, chemical etch with etch stops, and/or plasma assisted chemical etch, can be used to further thin the top wafer to a thickness on the order of a micron after the wafers are bonded. Besides oxide or silicon, silicon has been bonded on other materials such as sapphire wafers.

Figure 4A:
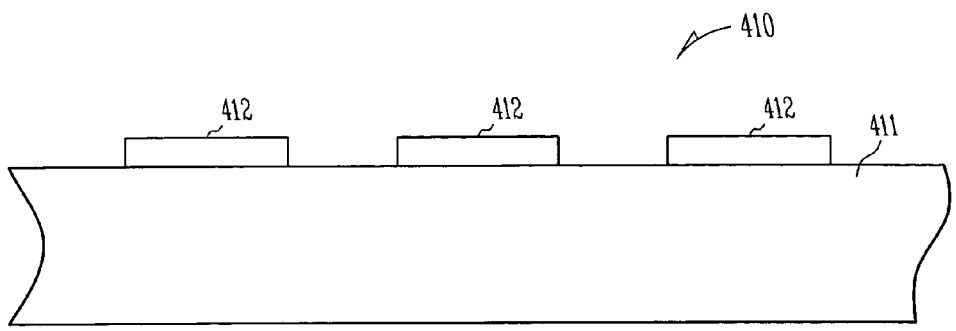
FIGS. 4A–4C illustrate a process for forming recesses in or dimpling a substrate using a LOCal Oxidation of Silicon (LOCOS) process according to various embodiments of the present invention.
Figure 4B:
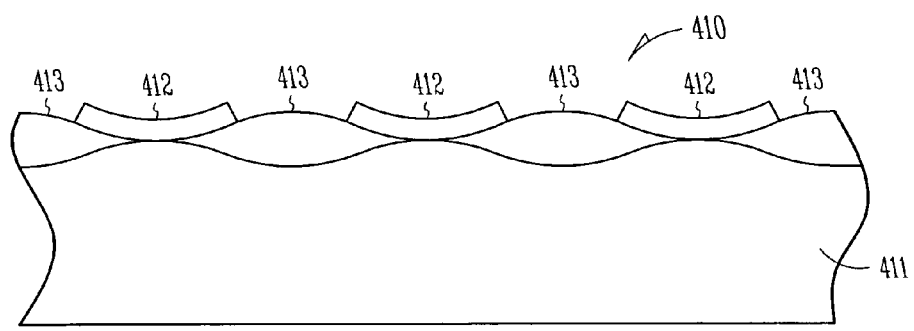
Figure 4C:
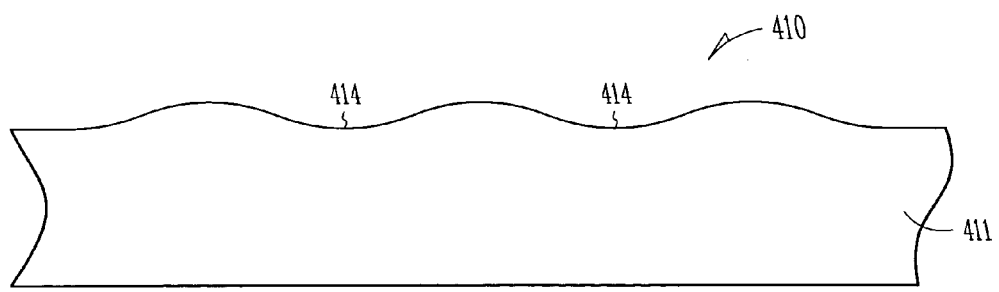

FIGS. 4A–4C illustrate a process for forming recesses in a substrate, or for dimpling a substrate, using a LOCal Oxidation of Silicon (LOCOS) process according to various embodiments of the present invention. The LOCOS process is useful to form recesses in silicon substrates. One of ordinary skill in the art will understand, upon reading and comprehending this disclosure, that other methods to form recesses in substrates can be used for silicon and other substrates.

FIG. 4A illustrates a semiconductor structure 410 toward the beginning of a LOCOS process. The semiconductor structure 410 includes a silicon substrate 411. A layer of silicon nitride 412 is deposited, such as by Chemical Vapor Deposition (CVD) and the like, on the silicon substrate and is etched to expose portions of the silicon substrate for subsequent selective oxidation. One of ordinary skill in the art will understand, upon reading and comprehending this disclosure, that the pattern of the silicon nitride affects the pattern and characteristics of the recesses and thus of the strained semiconductor film.

FIG. 4B illustrates the semiconductor structure 410 after the silicon substrate 411 has been oxidized. In various embodiments, the oxide 413 is thermally grown by means of wet oxidation. The oxide grows where there is no masking nitride. At the edges of the nitride, some oxidant diffuses laterally to grow under the nitride edges. This lateral growth has the shape of a slowly tapering oxide wedge 414 and is commonly referred to as a "bird's beak."

FIG. 4C illustrates the semiconductor structure 410 after the oxide has been removed. Recesses 414 remain where the oxidation occurred. Because of the formation of the recesses 414, the substrate 411, also referred to as a first wafer, can be referred to as a dimpled substrate as, in various embodiments, the substrate has a dimpled appearance. As provided below, a second wafer, or membrane, is bonded to the substrate such that portions of the second wafer are strained in the recesses of the substrate.

One benefit of the LOCOS process is that it is a common economical semiconductor fabrication process. Another benefit of the LOCOS process is the tapered bird's beak, which allows for controlled strain in the film. One of ordinary skill in the art will understand, upon reading and comprehending this disclosure, that the slowly tapering shape of the bird's beak is useful to controllably induce strain in ultra-thin semiconductor films. However, the tapered bird's beak shape is not required to practice the present subject matter. One of ordinary skill in the art will understand, upon reading and comprehending this disclosure, that other means for creating a recess or void in the substrate can be used. For example, a grinding process can be used to create a recess or a trench can be otherwise formed in the substrate.

FIGS. 5A–5E illustrate a method to form a strained semiconductor membrane using a bond cut process to bond a membrane to a substrate with recesses, according to various embodiments of the present invention. The bond cut process involves bonding together two substrates, or wafers, and breaking off a section of at least one of the two substrate after the substrates have been bonded together. The substrate is also referred to herein in various embodiments as a first wafer or dimpled substrate, and the membrane is also referred to herein in various embodiments as a second wafer.

Figure 5A:
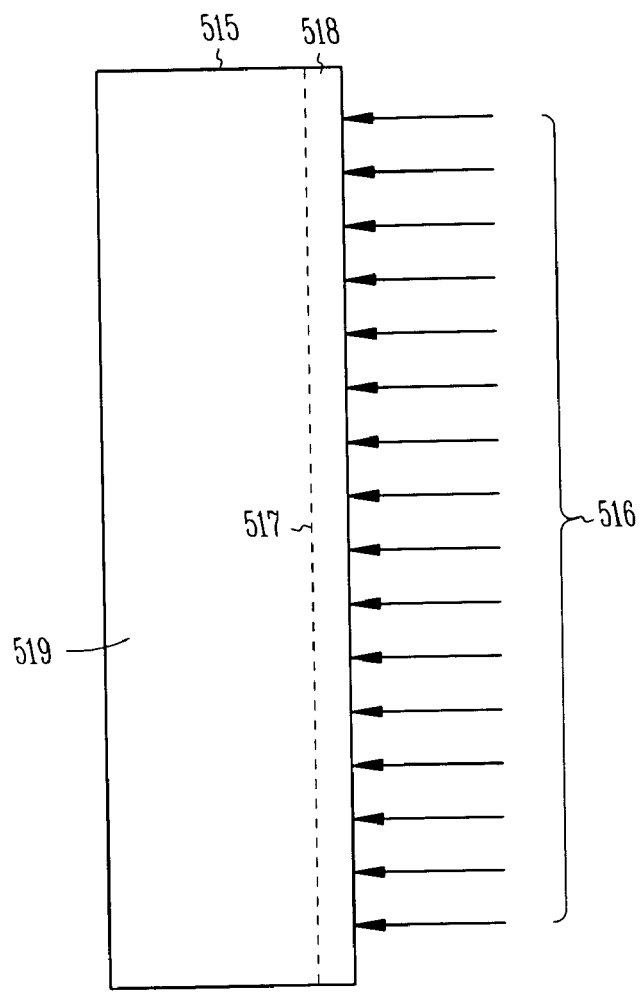
FIGS. 5A–5E illustrate a method to form a strained semiconductor membrane using a bond cut process to bond a membrane to a substrate with recesses according to various embodiments of the present subject matter.
Figure 5B:
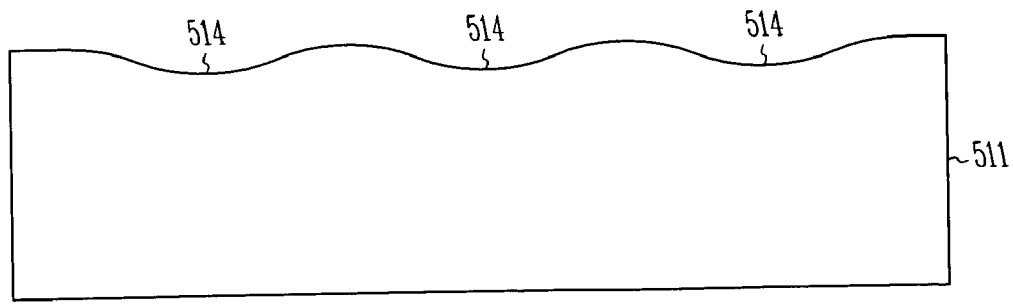

FIG. 5A illustrates a sacrificial semiconductor wafer 515, and FIG. 5B illustrates a semiconductor substrate 511. The substrate 511 includes a semiconductor material, and includes a number of recesses 514, such as illustrated in FIG. 4C. In various embodiments, the semiconductor material includes one of the following materials: silicon; germanium; silicon-germanium; gallium arsenide; indium phosphide; and other semiconductor materials. This list of potential semiconductor materials is not intended to be an all-inclusive list. The silicon substrate is cut into wafer size patterns, and integrated circuits are formed thereon. In various embodiments, the sacrificial wafer includes various semiconductor material including but not limited to silicon, germanium, silicon-germanium, gallium arsenide, indium phosphide, and other semiconductor materials.

Figure 5C:
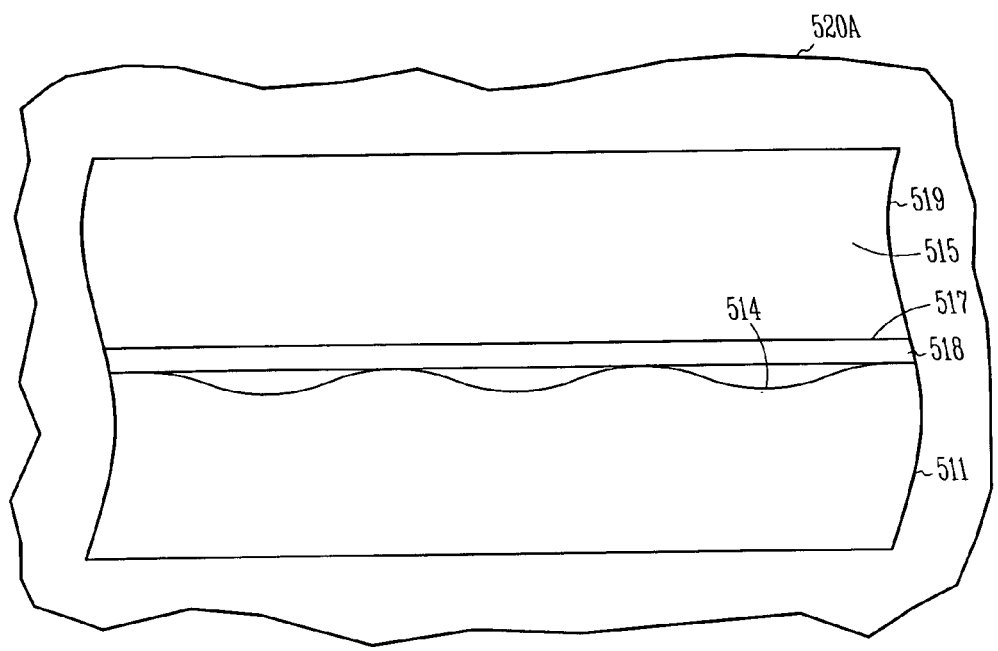
Figure 5D:
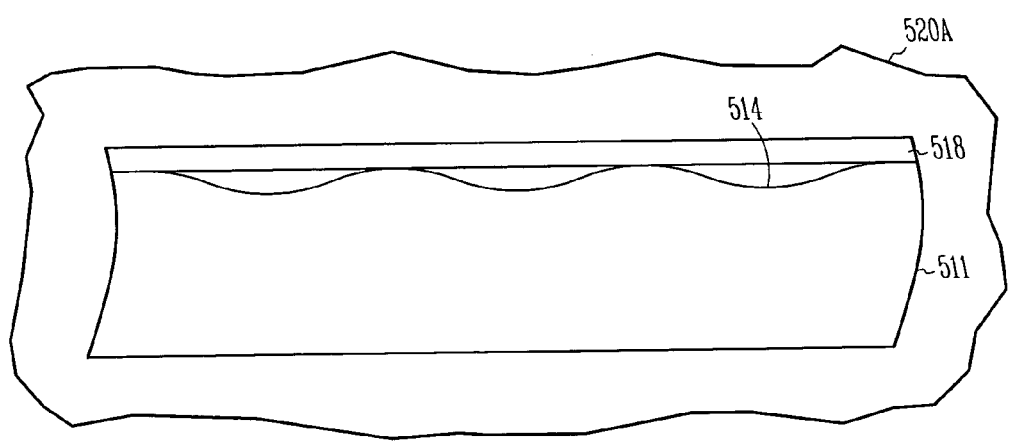

The sacrificial wafer 515 is a single crystal wafer, and is conditioned by implanting ions 516 into a surface. The ions are implanted along a plane, represented in FIG. 5 as a line 517, to define a surface layer 518 with a predetermined thickness. The plane is approximately parallel to the surface in which the ions are implanted. In various embodiments, hydrogen ions are used as implantation ions. The hydrogen ions can include $H^+$, $H_2^+$, $D^+$, and/or $D_2^+$ ions. The implanted ions act 516 to form cavities along the plane 517. The cavities are joined through thermal processing, allowing the surface layer 518 to be removed from the remaining portion of the sacrificial wafer 519 at the cleavage plane 517. In various embodiments, this thermal processing occurs while the surface layer 518 is being bonded to the substrate 511, as shown in FIG. 5C. Once these cavities join and the surface layer is bonded to the substrate, the surface layer breaks off of the sacrificial wafer at the cleavage plane and remains bonded to the substrate. The remaining portion of the sacrificial wafer 519 can be used to form membranes for other substrates, thus reducing waste the overall cost for the manufacturing process of a wide variety of electronic devices.

FIG. 5C illustrates the surface layer 518 of the sacrificial wafer 515 bonded to the substrate 511. Before the surface layer is bonded to the substrate, the sacrificial wafer and the substrate can be cleaned using conventional cleaning procedures. In various embodiments, the bonding force includes the strong Van der Waal's force that naturally bonds surfaces together as the bonding force. In various embodiments, the Van der Waal's force provides an initial bonding force that is strengthened during subsequent thermal processing. As illustrated in FIG. 5C, the surface layer 518 of the sacrificial wafer 515 is bonded to the substrate 511 in an environment 520A at a first pressure. In various embodiments, the first pressure is a vacuum.

In various embodiments, the bonded wafers are heated to further bond the surface layer to the substrate and to cut the surface layer 518 from the sacrificial wafer 510. In various embodiments, the environment 520A has a bonding temperature within a range of approximately 300° C. to 400° C. Heating the sacrificial wafer joins the cavities in the cleavage plane 517, allowing the remaining portion 519 of the sacrificial wafer to be removed from the surface layer, which remains bonded to the substrate. The remaining portion 519 of the sacrificial wafer can be prepared and conditioned for another bond cut process.

The thickness of the surface layer 518 bonded to the substrate 511 is defined by the depth of ion implantation 516 during the bond cut process. In various embodiments, the thickness of the surface layer 518 is such that it does not yield or otherwise plastically deform under the desired mechanical strain induced by the bond. In various embodiments, the thickness of the surface layer 518 is less than 200 nm, such that it can be termed an ultra thin wafer. In various embodiments, the silicon layer has a thickness of about 0.1 microns (100 nm or 1000 Å). In various embodiments, the silicon layer has a thickness less than 0.1 microns. In various embodiments, the silicon layer has a thickness in a range of approximately 300 Å to 1000 Å.

In various embodiments, the silicon film is prepared for transistor fabrication. In various embodiments, the preparation of the film includes grinding, polishing, chemical etch, chemical etch with etch stops, and/or plasma assisted chemical etch, and the like, which can be used to further thin the film. Thus, the membrane bonded to the substrate illustrated in FIG. 5D can be thinner than the surface layer defined in the sacrificial layer in FIG. 5A. Device processing can be accomplished using conventional processes and procedures.

Figure 5E:
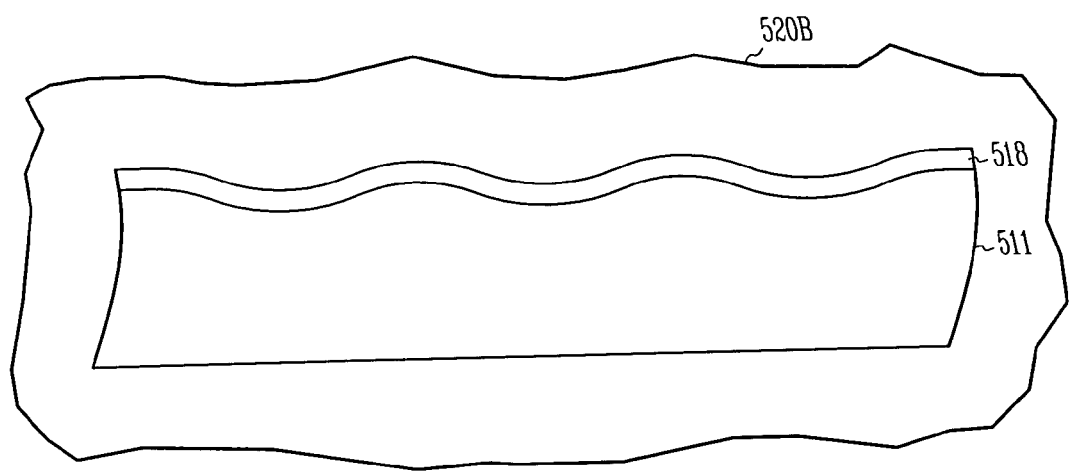

FIG. 5E illustrates the membrane 518 further bonded to the substrate 511 in the recesses 514 formed therein. The process is performed in an environment 520B having a second temperature. The second pressure is greater than the first pressure to force the membrane into the recesses. The volume between the membrane and the recessed substrate is a sealed volume, such that the pressure inside these volumes is approximately the first pressure. In various embodiments, the second pressure is atmospheric pressure. In various embodiments, the environment 520B has a bonding temperature within a range of approximately 800° C. to 1000° C. The portion of the membrane bonded to the substrate in the recesses is strained. One of ordinary skill in the art will understand, upon reading and comprehending this disclosure, that the recesses can be made with appropriate dimension to provide a desired strain.

Figure 6:
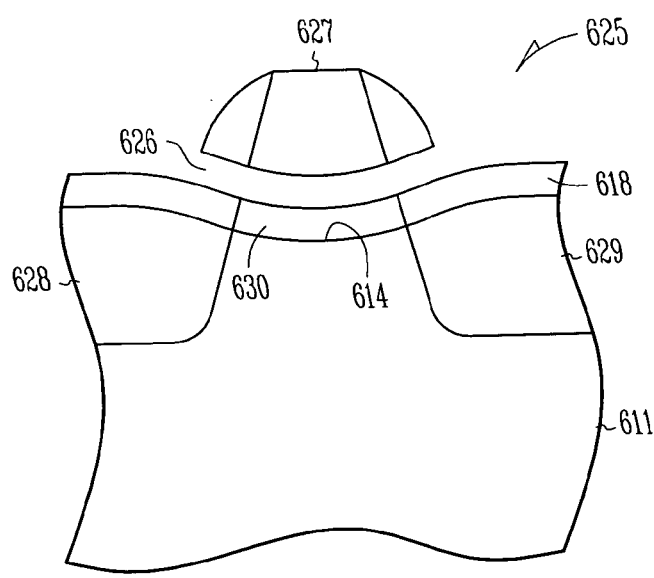
FIG. 6 illustrates a transistor fabricated with a strained semiconductor membrane according to various embodiments of the present invention.

FIG. 6 illustrates a transistor fabricated with a strained semiconductor membrane, according to various embodiments of the present invention. The illustrated transistor 625 includes a crystalline semiconductor substrate 611 with a recess 614, and a crystalline semiconductor membrane 618 bonded to the substrate 611 to provide the membrane 618 with a desired strain in the recesses. A gate dielectric 626 is formed on the strained membrane, and a gate 627 is formed on the gate dielectric 626. First and second diffusion regions 628 and 629 are formed in the structure 625. The strained semiconductor membrane 618 between the first and second diffusion regions 628 and 629 forms a channel region 630.

Figure 7A:
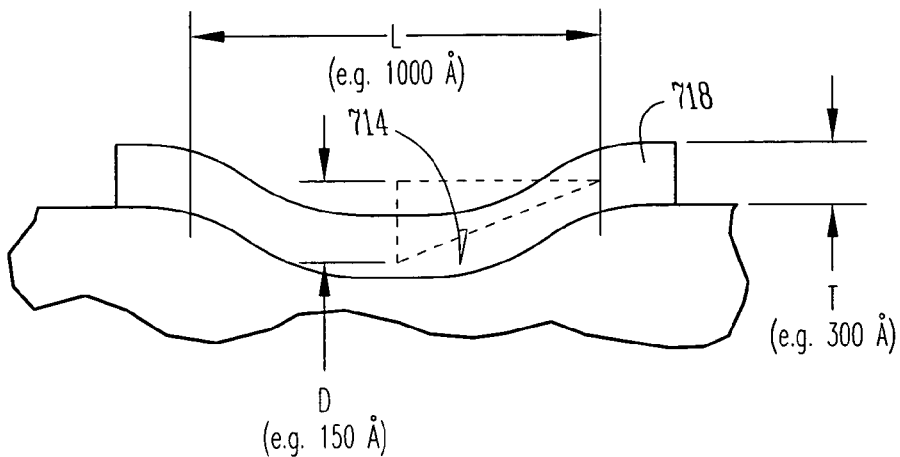
FIGS. 7A–7C illustrate the uniaxial strain in the semiconductor layer achieve according to various embodiments of the present invention.
Figure 7B:
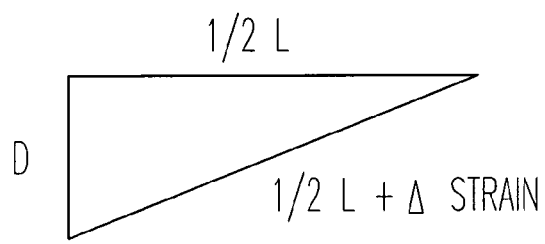
Figure 7C:
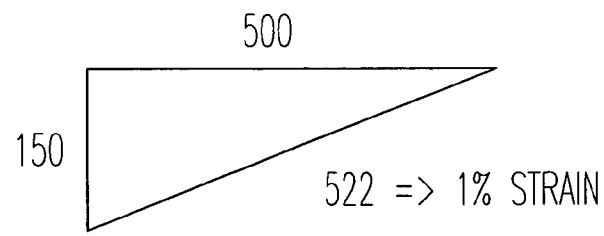

FIGS. 7A–7C illustrate the uniaxial strain in the semiconductor layer achieve according to various embodiments of the present invention. Referring to FIG. 7A, the illustrated semiconductor layer 618 is collapsed and bonded to the substrate within the recess 614. In various embodiments, the illustrated semiconductor layer is an ultra-thin single crystalline silicon layer. In various embodiments, the semiconductor layer has a thickness within a range of approximately 300 Å to 1000 Å. In various embodiments, the semiconductor layer has a thickness (T) of about 300 Å (30 nm) suitable for use to form a transistor channel less than or equal to about 1000 Å (100 nm). If the recess is formed with a depth (D) of about 150 Å (15 nm) and a length (L) of about 1000 Å (100 nm), the single crystalline silicon layer will undergo a micro-mechanical strain (A strain) attributable to the dimpling of the layer into the recess.

Referring to FIG. 7B, the dimpling process can be geometrically represented using a triangle with a first leg representing ½ L (half the length of the recess), and a second leg representing D (the depth of the recess). The hypotenuse of the triangle represents the strained layer (½ L+Δ strain). FIG. 7C illustrates the representation of FIG. 5B with values. In FIG. 7C, the first leg of the triangle is 500 Å and the second leg is 150 Å such that the hypotenuse is 522 Å. Thus, in the example shown in FIG. 5A, the induced strain in the single crystalline silicon layer is about 1.5%.

As stated earlier with respect to Si/SiGe layers, it is desired to provide silicon with a biaxial strain around or greater than 0.5% and preferably a biaxial strain of 1% or greater to obtain the desired enhanced mobility associated with strained silicon. Thus, as shown by the example illustrated in FIGS. 5A–5E, various embodiments of the present invention are capable of providing uniaxial strains in this range. One of ordinary skill in the art will understand, upon reading and comprehending this disclosure, how to form recesses or dimples in the substrate such that the bonded membrane is either uniaxially or biaxially strained in a desired amount. As stated earlier in the Background section, uniaxial strain has advantages over biaxial strain as it reduces band gap and in-plane effective mass to improve conduction.

FIGS. 8A–8F illustrate a process for creating a pattern of recesses or dimples in a semiconductor substrate, and bonding a membrane to the substrate to create a locally strained film semiconductor useful for creating devices according to various embodiments of the present invention. Semiconductor devices are capable of being fabricated to incorporate the strained film. For example, the dimpled or micro-mechanically strained film is capable of being incorporated in the channel region of MOSFETs.

Figure 8A:
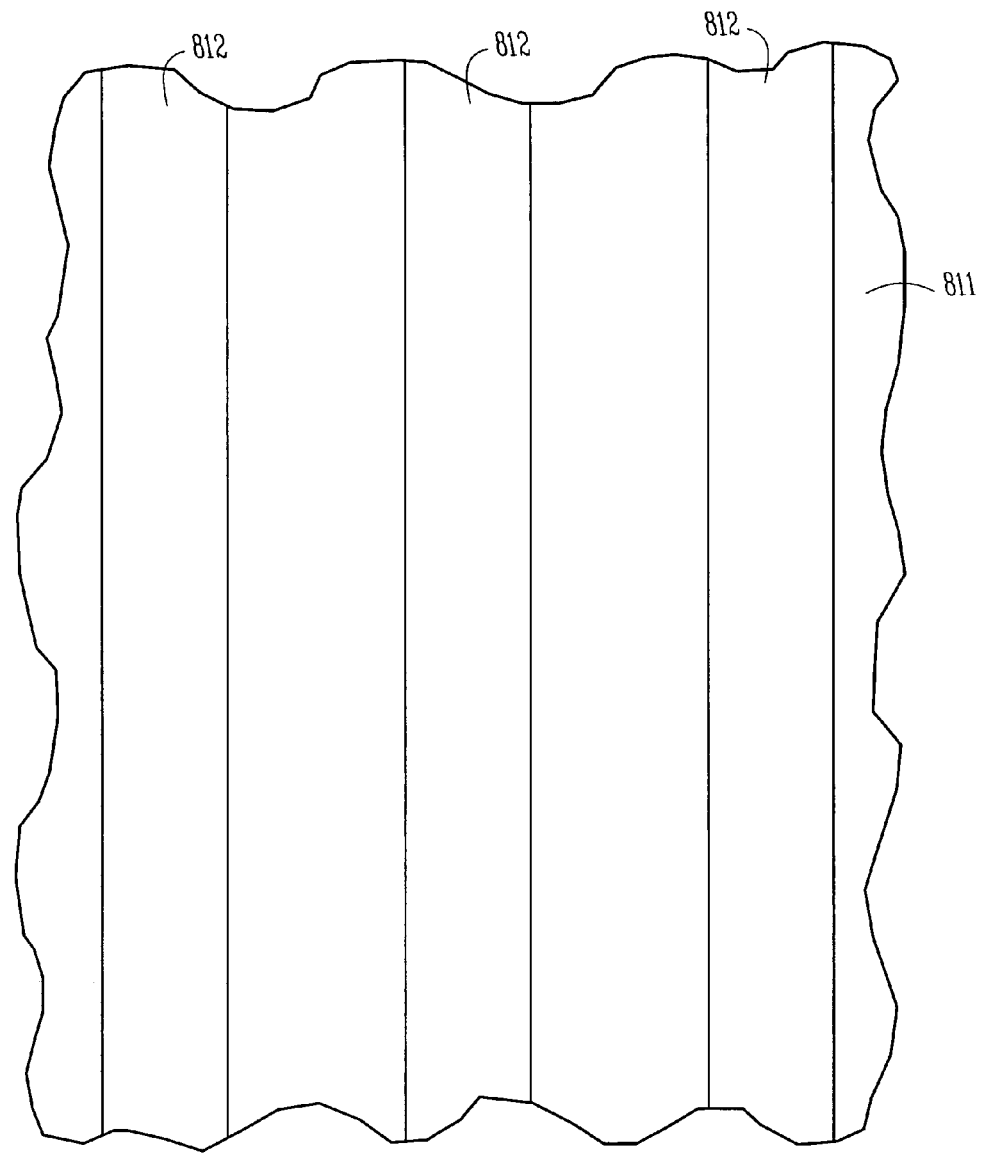
FIGS. 8A and 8B provide top and cross section views, respectfully, to illustrate a pattern of silicon nitride on a silicon substrate in preparation for performing a LOCOS process according to various embodiments of the present invention.
Figure 8B:
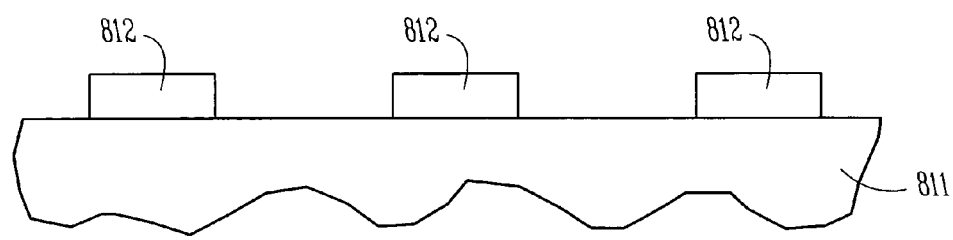

FIGS. 8A and 8B provide top and cross section views, respectfully, to illustrate a pattern of silicon nitride on a silicon substrate in preparation for performing a LOCOS process, according to various embodiments of the present invention. These views illustrate bars of silicon nitride 812 deposited on a silicon substrate 811. One of ordinary skill in the art will understand, upon reading and comprehending this disclosure, that the pattern of the silicon nitride corresponds to the pattern of the resulting recesses in the substrate, which in turn correspond to the pattern of strained film areas which are incorporated in semiconductor devices. The LOCOS process oxidizes the exposed portions of the substrate. The silicon nitride is removed and the substrate is planarized.

Figure 8C:
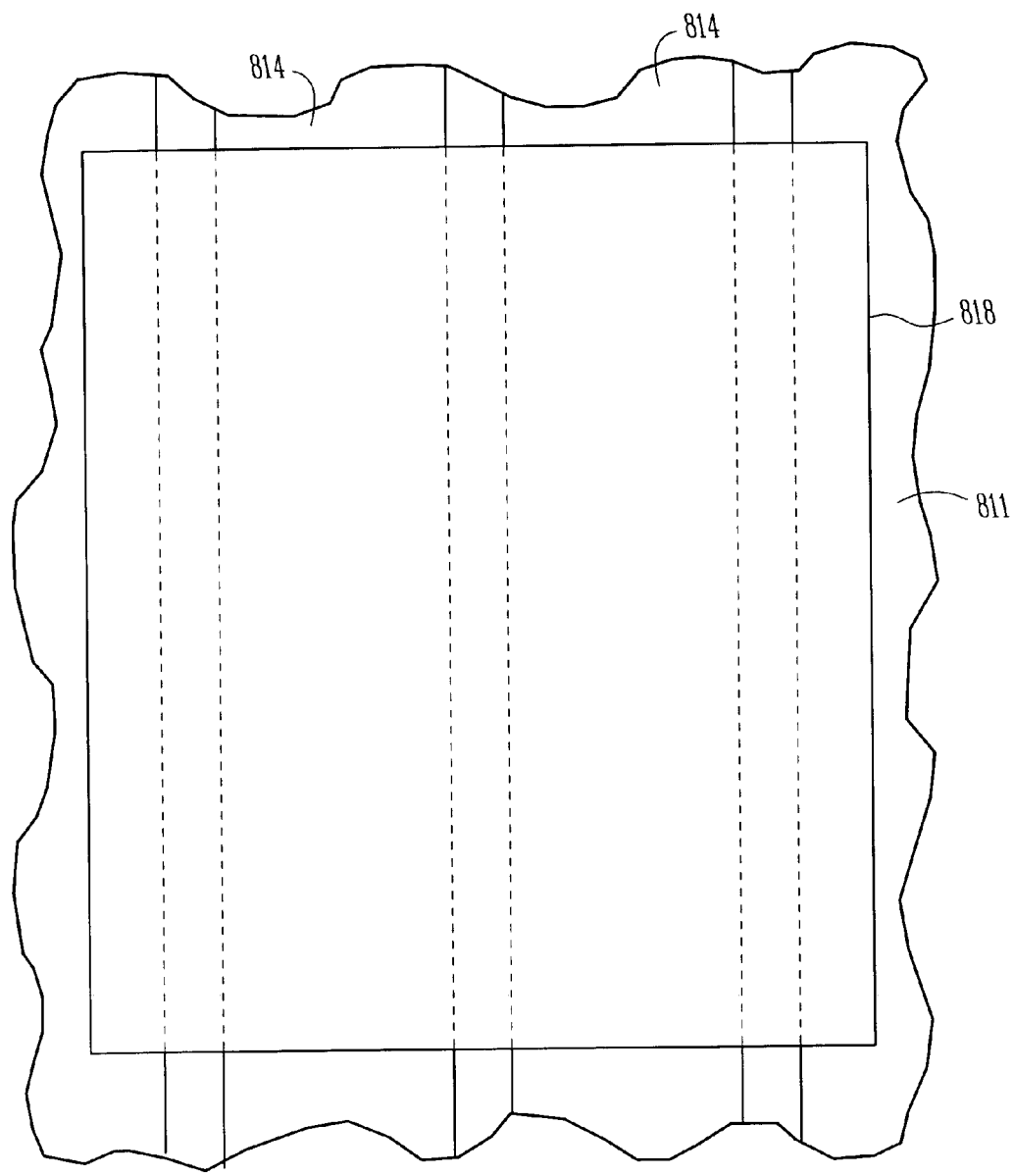
FIGS. 8C and 8D provide top and cross section views, respectfully, to illustrate a membrane bonded to the substrate with recesses formed in a top surface thereof according to various embodiments of the present invention.
Figure 8D:
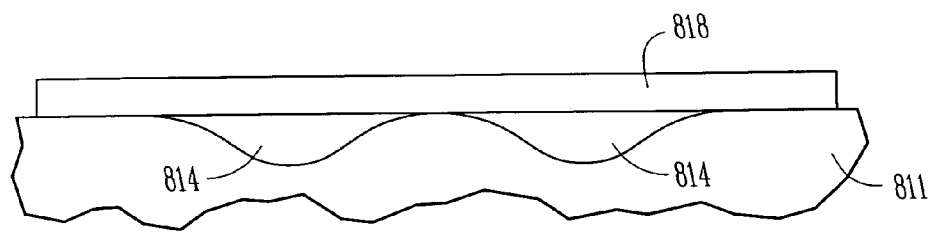

FIGS. 8C and 8D provide top and cross section views, respectfully, to illustrate a membrane bonded to the substrate with recesses formed in a top surface thereof according to various embodiments of the present invention. One of ordinary skill in the art will understand, upon reading and comprehending this disclosure, that the volume between the recesses and membrane is effectively sealed such that it is at or near the first pressure. This bonding occurs in an environment having a first pressure and a first bonding temperature. In various embodiments, the first pressure is a vacuum. In various embodiments, the bonding temperature is within a range of approximately 300° C. to 400° C.

Figure 8E:
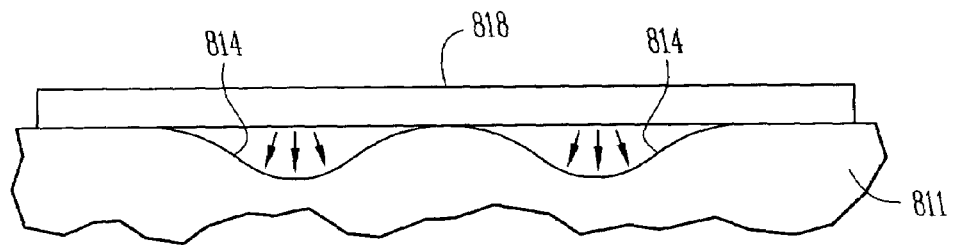
FIG. 8E illustrates the membrane being influenced into the recesses in the substrate according to various embodiments of the present invention.

FIG. 8E illustrates the membrane being influenced into the recesses in the substrate according to various embodiments of the present invention. A force, illustrated in the figure as arrows, acts to influence the single crystalline silicon film into the recesses, and bond the film to the substrate. Thus, a localized strain is induced in the film. The bonding occurs in an environment having a second pressure and a second bonding temperature. The second pressure is larger than the first pressure such that the membrane is influenced into the recesses. In various embodiments, the second pressure is atmospheric pressure. In various embodiments, the bonding temperature is within a range of approximately 800° C. to 1000° C.

Figure 8F:
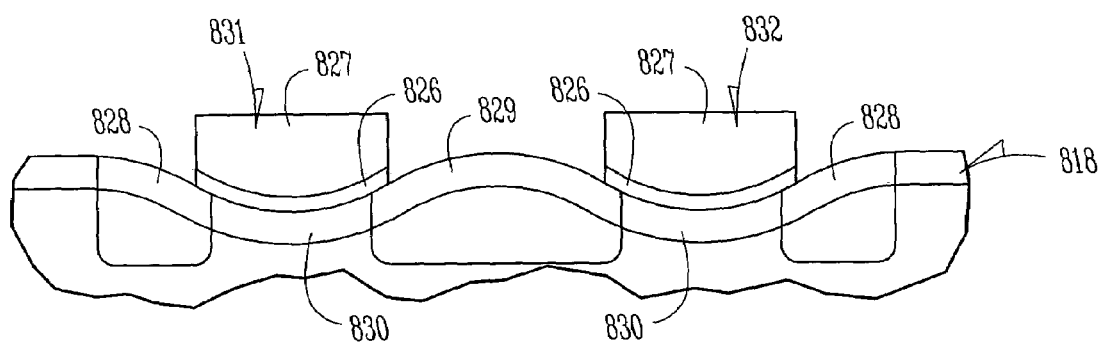
FIG. 8F provides a cross section view of two transistor devices in an array of transistor devices in which the transistor devices are formed using strained semiconductor films according to various embodiments of the present invention.

FIG. 8F provides a cross section view of two transistor devices in an array of transistor devices in which the transistor devices are formed using strained semiconductor films according to various embodiments of the present invention. Each transistor 831 and 832 includes an ultra-thin body 830 formed with strained semiconductor film 818. In various embodiments, the film 818 is ultra thin (under 1000 Å). In various embodiments, the film 818 is approximately 1000 Å or less. In various embodiments, the channel length of the transistor is less than or equal to about 1000 Å, and the thickness of the film is less than or equal to about 300 Å. The strain enhances mobility in the channel, thus overcoming problems associated with heavy channel doping.

One of ordinary skill in the art will understand, upon reading and comprehending this disclosure, that the transistors can be fabricated in the micro-mechanical strained ultra-thin silicon body layer using conventional techniques. Each transistor includes a gate insulator 826, such as a gate oxide and the like, deposited over the channel region, and a gate 827 deposited over the gate insulator. Each transistor includes a first diffusion region 828 and a second diffusion region 829. In the illustrated embodiment, the transistors share second diffusion regions 829. Other layouts are encompassed in various embodiments. One of ordinary skill in the art will also understand, upon reading and comprehending this disclosure, how to fabricate the appropriate wiring level(s) for these transistors.

The diffusion regions can be formed using a number of processes. In various embodiments, for example, the substrate includes appropriately doped regions beneath the desired diffusion regions in the semiconductor film. These diffusion regions in the substrate may be positioned where the thin film region contacts the substrate in FIG. 5C. When the silicon film is annealed, impurities diffuse from the film into the desired regions in the single crystalline substrate.

Figure 9:
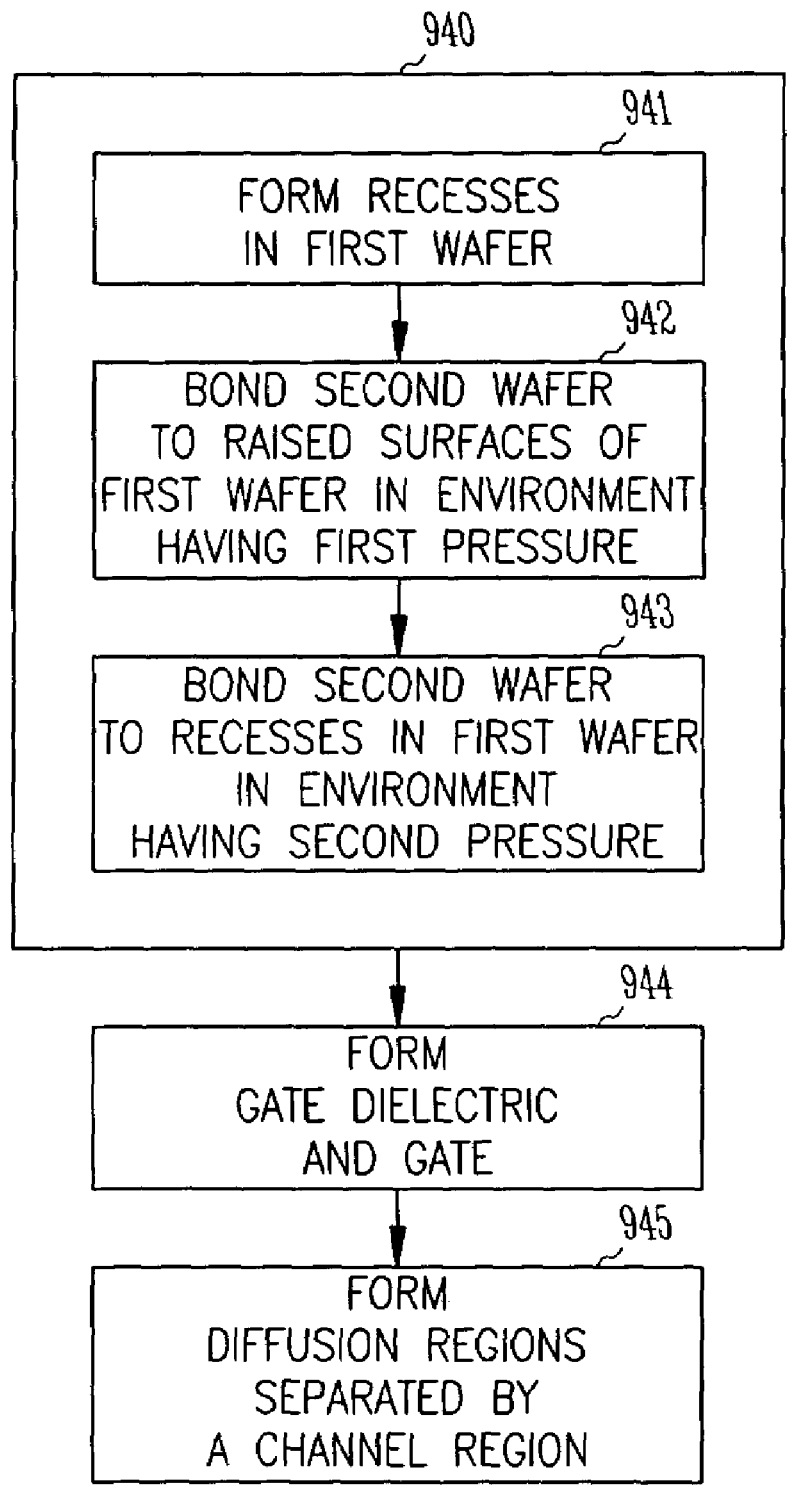
FIG. 9 illustrates a method for forming a strained semiconductor film according to various embodiments of the present invention.

FIG. 9 illustrates a method for forming a strained semiconductor film according to various embodiments of the present invention. In the illustrated embodiment, a strained semiconductor wafer is formed at 940. The illustrated formation of the strained semiconductor wafer includes: at 941, forming recesses in a first wafer; at 942, bonding a second wafer to raised surfaces of the first wafer in an environment having a first pressure; and at 943, bonding the second wafer to recesses in the first wafer in an environment having a second pressure. At 942, the second wafer can be further thinned to a desired dimension. The semiconductor wafer is influenced into the recesses and bonded to the substrate at 943. Thus, the semiconductor wafer has locally strained regions. In various embodiments, the first pressure is a vacuum and the second pressure is atmospheric pressure. A gate dielectric and a gate are formed over a locally strained region at 944, and diffusion regions are formed at 945. The diffusion regions are separated a channel region in the strained semiconductor wafer beneath the gate.

Figure 10:
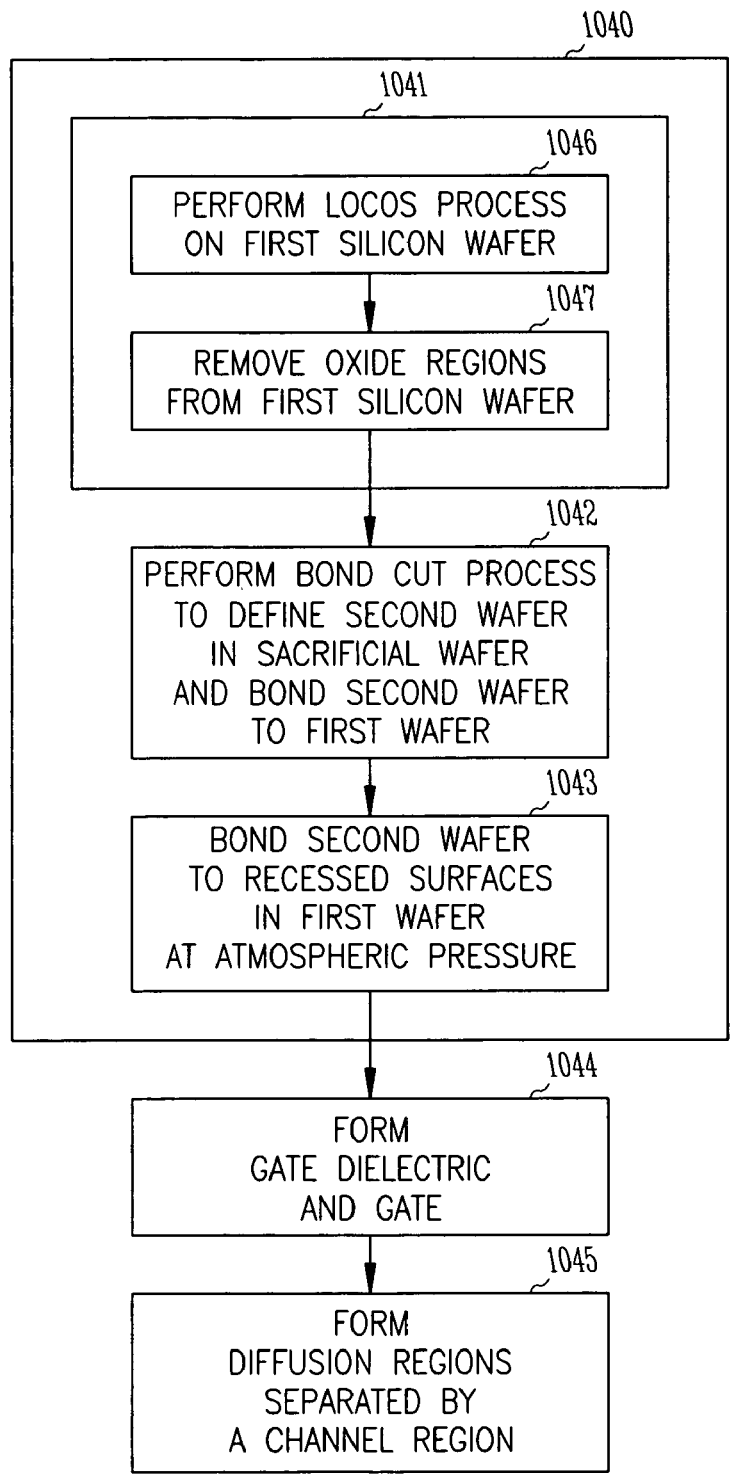
FIG. 10 illustrates a method for forming a strained semiconductor film according to various embodiments of the present invention.

FIG. 10 illustrates a method for forming a strained semiconductor film according to various embodiments of the present invention. In the illustrated embodiment, a strained semiconductor wafer is formed at 1040. The illustrated formation of the strained semiconductor wafer includes: at 1041, forming recesses in a first wafer; at 1042, performing a bond cut process to define a second wafer in a sacrificial wafer to bond a second wafer to the first wafer; and at 1043, bonding a second wafer to recessed surfaces in a first wafer at atmospheric pressure. The illustrated formation of recesses in the first wafer includes: at 1046, performing a LOCOS process on the first silicon wafer; and at 1047, removing oxide regions from a first silicon wafer. At 1042, the second wafer can be further thinned to a desired dimension. The semiconductor wafer is influenced into the recesses and bonded to the substrate at 1043. Thus, the semiconductor wafer has locally strained regions. In various embodiments, the first pressure is a vacuum and the second pressure is atmospheric pressure. A gate dielectric and a gate are formed over a locally strained region at 1044, and diffusion regions are formed at 1045. The diffusion regions are separated by a channel region in the strained semiconductor wafer beneath the gate.

Figure 11:
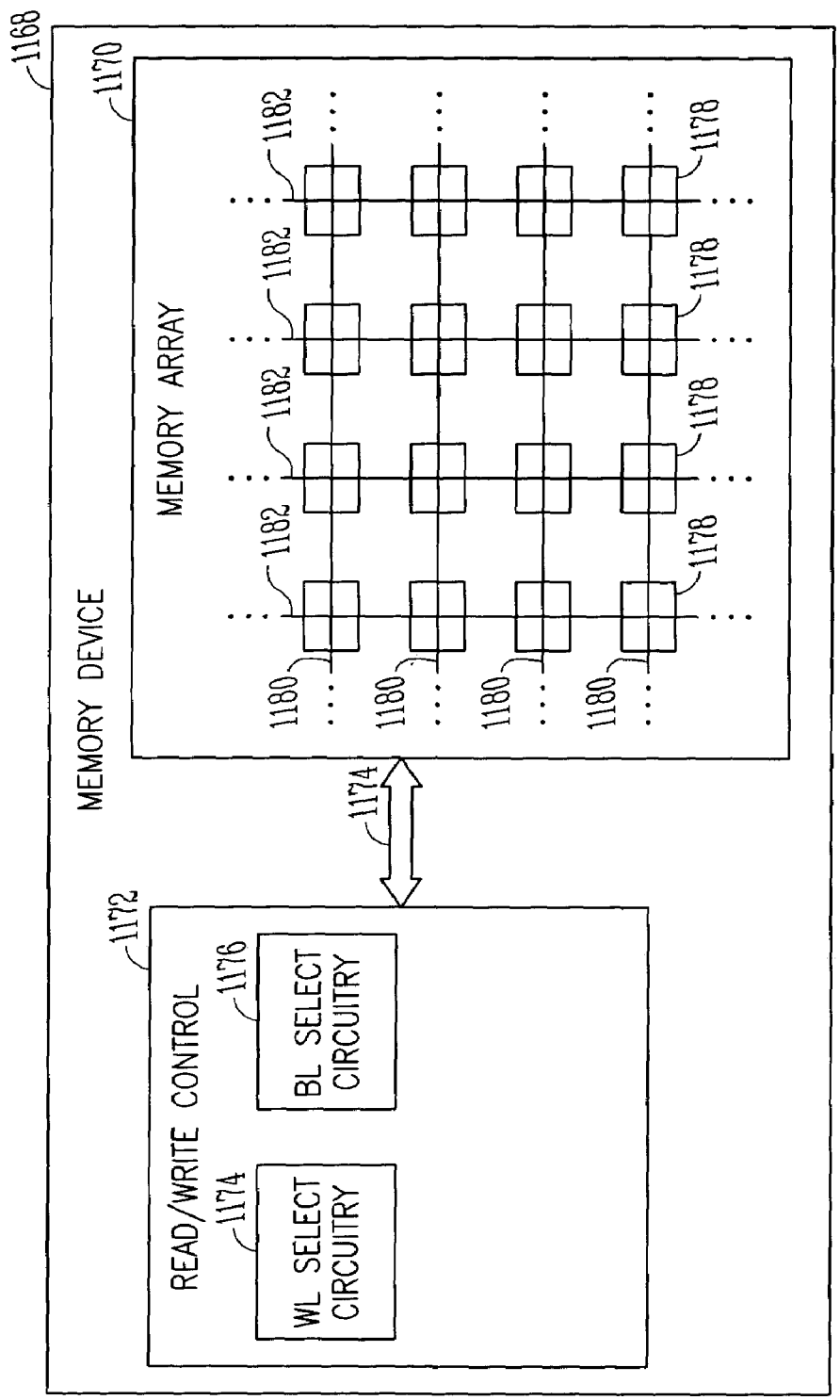
FIG. 11 is a simplified block diagram of a high-level organization of various embodiments of a memory device according to various embodiments of the present invention.

FIG. 11 is a simplified block diagram of a high-level organization of various embodiments of a memory device according to various embodiments of the present invention. The illustrated memory device 1168 includes a memory array 1170 and read/write control circuitry 1172 to perform operations on the memory array via communication line(s) 1174. The illustrated memory device 1168 may be a memory card or a memory module such as a single inline memory module (SIMM) and dual inline memory module (DIMM). One of ordinary skill in the art will understand, upon reading and comprehending this disclosure, that semiconductor components in the memory array 1170 and/or the control circuitry 1172 are able to be fabricated using the strained semiconductor films, as described above. For example, in various embodiments, the memory array 1170 and/or the control circuitry 1172 include transistors with strained body layers formed according to various embodiments of the present invention. The structure and fabrication methods for these strained body layers have been described above.

The memory array 1170 includes a number of memory cells 1178. The memory cells in the array are arranged in rows and columns. In various embodiments, word lines 1180 connect the memory cells in the rows, and bit lines 1182 connect the memory cells in the columns. The read/write control circuitry 1172 includes word line select circuitry 1174, which functions to select a desired row. The read/write control circuitry 1172 further includes bit line select circuitry 1176, which functions to select a desired column.

Figure 12:
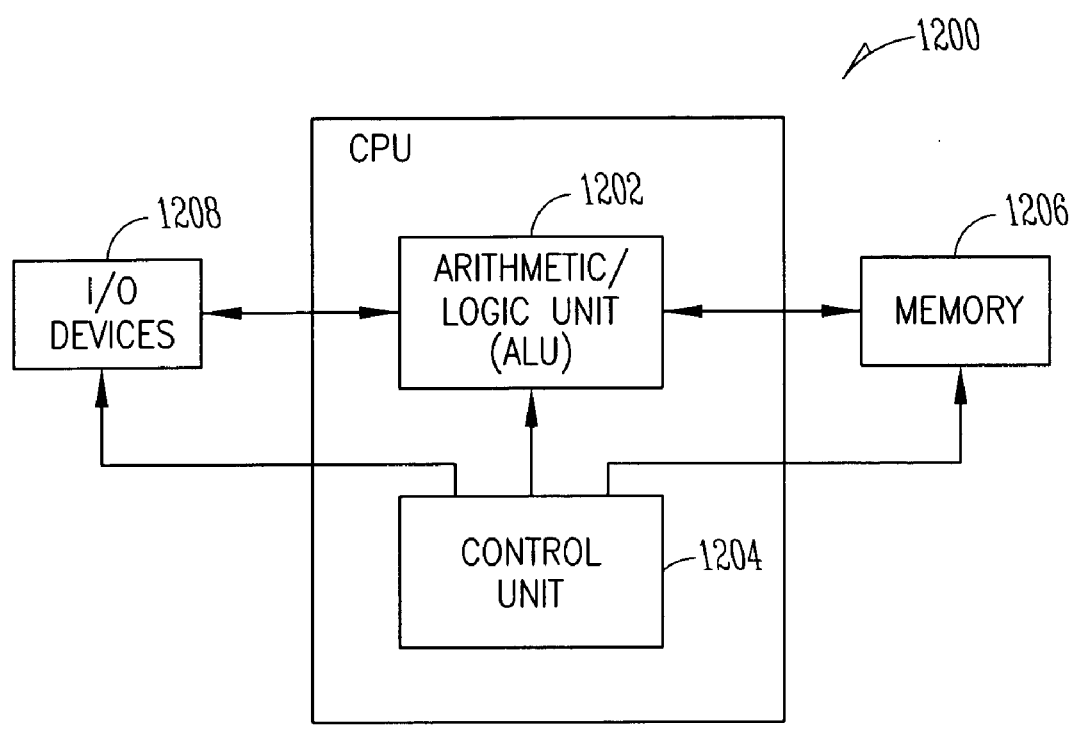
FIG. 12 is a simplified block diagram of a high-level organization of various embodiments of an electronic system according to various embodiments of the present invention.

FIG. 12 is a simplified block diagram of a high-level organization of various embodiments of an electronic system according to the present invention. In various embodiments, the system 1200 is a computer system, a process control system or other system that employs a processor and associated memory. The electronic system 1200 has functional elements, including a processor or arithmetic/logic unit (ALU) 1202, a control unit 1204, a memory device unit 1206 (such as illustrated in FIG. 11) and an input/output (I/O) device 1208. Generally such an electronic system 1200 will have a native set of instructions that specify operations to be performed on data by the processor 1202 and other interactions between the processor 1202, the memory device unit 1206 and the I/O devices 1208. The control unit 1204 coordinates all operations of the processor 1202, the memory device 1206 and the I/O devices 1208 by continuously cycling through a set of operations that cause instructions to be fetched from the memory device 1206 and executed. According to various embodiments, the memory device 1206 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include strained semiconductors in accordance with various embodiments of the present invention.

The illustration of the system 1200 is intended to provide a general understanding of one application for the structure and circuitry of the present subject matter, and is not intended to serve as a complete description of all the elements and features of an electronic system using strained semiconductor films according to the present subject matter. As one of ordinary skill in the art will understand, such an electronic system can be fabricated in single-package processing units, or even on a single semiconductor chip, in order to reduce the communication time between the processor and the memory device.

Applications containing strained semiconductor films, such as transistors with a strained semiconductor body layer, as described in this disclosure include electronic systems for use in memory modules, device drivers, power modules, communication modems, processor modules, and application-specific modules, and may include multilayer, multichip modules. Such circuitry can further be a subcomponent of a variety of electronic systems.

CONCLUSION

Disclosed herein is a technique to provide strained semiconductor layers by bonding, or wafer bonding, a crystalline semiconductor membrane to a substrate with recesses. Strained semiconductor membranes, including uniaxially strained films, are fabricated using common and economical semiconductor processing techniques. In various embodiments, a number of recesses that have a predetermined shape and dimension are formed at a predetermined position in a silicon substrate using a LOCOS process. In various embodiments, a semiconductor membrane is formed and bonded to the substrate using a bond-cut process. The membrane is bonded to the raised portions of the silicon substrate in an environment having a first pressure, and then is into the recesses of the silicon substrate in an environment having a second pressure. The second pressure is greater than the first pressure, and is sufficiently large to influence the membrane into the recesses. In various embodiments, the first pressure is a vacuum, and the second pressure is atmospheric pressure. In various embodiments, the membrane has a thickness within a range of approximately 300 Å to 1000 Å and has a strain greater than 0.5% such that the strained membrane is characterized by enhanced carrier mobility. In various embodiments, the membrane is bonded to the raised portions of the silicon substrate in an environment having a lower pressure and a temperature within a range of approximately 300° C. and 400° C., and then is bonded into the recesses of the silicon substrate in an environment having a higher pressure and a temperature within a range of approximately 800° C. and 1000° C.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A transistor, comprising:
   a silicon substrate having a surface with a number of tapered recesses formed by a Local Oxidation of Silicon (LOCOS) process, each recess having a length of approximately 1000 Å and a depth of approximately 150 Å; and
   a silicon membrane bonded to the substrate, the membrane having an approximate 1% strain where the membrane is bonded to the substrate in the number of recesses;
   a channel region between a first diffusion region and a second diffusion region, the channel region being positioned in the strained silicon layer;
   a gate dielectric positioned to oppose the channel region; and
   a gate positioned to oppose the gate dielectric.

2. The transistor of claim 1, wherein the silicon membrane has a thickness less than 2000 Å (200 nm).

3. The transistor of claim 1, wherein the silicon membrane has a thickness approximately 1000 Å (100 nm).

4. The transistor of claim 1, wherein the silicon membrane has a thickness within a range of approximately 300 Å to 1000 Å.

5. The transistor of claim 1, wherein the silicon membrane has a thickness less than 300 Å.

6. A transistor, comprising:
   a semiconductor film bonded to a wafer, the wafer including a tapered recess with a desired shape such that a portion of the semiconductor film that is bonded to the wafer within the recess has a desired mechanical strain for a transistor channel;
   a first diffusion region and a second diffusion region in the semiconductor film, the channel extending between the first and second diffusion regions in the semiconductor film bonded within the recess; and
   a gate positioned over the channel region with a gate dielectric positioned between the gate and the channel region.

7. The transistor of claim 6, wherein the tapered recess is sized to locally strain the semiconductor film for use as the transistor channel.

8. The transistor of claim 6, wherein both the first diffusion region and the second diffusion region are in both the wafer and the semiconductor film.

9. The transistor of claim 6, wherein the recess has a length of approximately 1000 Å and a depth of approximately 150 Å.

10. The transistor of claim 6, wherein the wafer includes silicon and the recess is formed by a Local Oxidation of Silicon (LOCOS) process.

11. The transistor of claim 6, wherein the semiconductor film has a thickness less than 2000 Å (200 nm).

12. The transistor of claim 6, wherein the semiconductor film has a thickness within a range of approximately 300 Å to 1000 Å.

13. A transistor, comprising:
    a silicon film bonded to a silicon wafer, the wafer including a tapered recess formed by a Local Oxidation of Silicon (LOCOS) process such that a portion of the film that is bonded to the wafer within the recess has a desired mechanical strain for a transistor channel, the silicon film having a thickness less than 2000 Å;
    a first diffusion region and a second diffusion region in the silicon film, the channel extending between the first and second diffusion regions in the silicon film bonded within the recess; and
    a gate positioned over the channel region with a gate dielectric positioned between the gate and the channel region.

14. The transistor of claim 13, wherein the channel length is approximately 1000 Å.

15. The transistor of claim 13, wherein the mechanical strain of the silicon film for the transistor channel is greater than approximately 0.5%.

16. The transistor of claim 13, wherein the mechanical strain of the silicon film for the transistor channel is within a range of approximately 0.75% and 1.5%.

17. The transistor of claim 13, wherein the mechanical strain of the silicon film for the transistor channel is approximately 1%.

18. The transistor of claim 13, wherein the silicon film has a thickness in a range between approximately 300 Å and 1000 Å.

19. A memory device, comprising:
    a memory array, including a plurality of memory cells in rows and columns, each memory cell including at least one transistor;
    a plurality of word lines, each word line connected to a row of memory cells;
    a plurality of bit lines, each bit line connected to a column of memory cells;
    control circuitry, including word line select circuitry and bit line select circuitry to select a number of memory cells for writing and reading operations,
    wherein at least one of the memory array and the control circuitry includes at least one transistor, including:
      a silicon substrate having a surface with a number of tapered recesses; and
      a silicon membrane bonded to the substrate, the membrane having a localized mechanical strain greater than 0.5% where the membrane is bonded to the substrate in the number of recesses;
      a channel region between a first diffusion region and a second diffusion region, the channel region being positioned in the localized mechanical strain of the silicon membrane;
      a gate dielectric positioned to oppose the channel region; and
      a gate positioned to oppose the gate dielectric.

20. The memory device of claim 19, wherein the silicon membrane has a thickness less than 2000 Å (200 nm).

21. The memory device of claim 19, wherein the silicon membrane has a thickness approximately 1000 Å (100 nm).

22. The memory device of claim 19, wherein the silicon membrane has a thickness within a range of approximately 300 Å to 1000 Å.

23. A memory device, comprising:
    a memory array, including a plurality of memory cells in rows and columns, each memory cell including at least one transistor;
    a plurality of word lines, each word line connected to a row of memory cells;
    a plurality of bit lines, each bit line connected to a column of memory cells;
    control circuitry, including word line select circuitry and bit line select circuitry to select a number of memory cells for writing and reading operations, wherein at least one of the memory array and the control circuitry includes at least one transistor, including:
- a silicon substrate having a surface with a number of tapered recesses; and
- a silicon membrane bonded to the substrate, the membrane having a thickness within a range of approximately 300 Å to 1000 Å, the membrane having a localized mechanical strain greater within a range of approximately 0.75% to 1.5% where the membrane is bonded to the substrate in the number of recesses;
- a channel region between a first diffusion region and a second diffusion region, the channel region being positioned in the localized mechanical strain of the silicon membrane;
- a gate dielectric positioned to oppose the channel region; and
- a gate positioned to oppose the gate dielectric over the channel region in the localized mechanical strain of the silicon membrane.

24. The memory device of claim 23, wherein the tapered recesses have a length of approximately 1000 Å and a depth of approximately 300 Å.

25. A memory device, comprising:
a memory array, including a plurality of memory cells in rows and columns, each memory cell including at least one transistor;
a plurality of word lines, each word line connected to a row of memory cells;
a plurality of bit lines, each bit line connected to a column of memory cells;
control circuitry, including word line select circuitry and bit line select circuitry to select a number of memory cells for writing and reading operations,
wherein at least one of the memory array and the control circuitry includes at least one transistor, including:
- a silicon substrate having a surface with a number of tapered recesses formed by a Local Oxidation of Silicon (LOCOS) process, each recess having a length of approximately 1000 Å and a depth of approximately 150 Å; and
- a silicon membrane bonded to the substrate, the membrane having an approximate 1% strain where the membrane is bonded to the substrate in the number of recesses;
- a channel region between a first diffusion region and a second diffusion region, the channel region being positioned in the strained silicon layer;
- a gate dielectric positioned to oppose the channel region; and
- a gate positioned to oppose the gate dielectric.

26. The memory device of claim 25, wherein the silicon membrane has a thickness less than 2000 Å (200 nm).

27. The memory device of claim 25, wherein the silicon membrane has a thickness within a range of approximately 300 Å to 1000 Å.

28. A semiconductor structure, comprising:
a wafer with a number of recesses;
a semiconductor membrane bonded to the wafer, wherein the recesses in the wafer are shaped such that a portion of the membrane bonds to the wafer within the recesses and is mechanically strained thereby to provide the membrane with localized strained regions;
a number of gates positioned over the semiconductor membrane, each gate positioned over a localized strained region of the semiconductor membrane with a gate dielectric positioned there between; and
diffusion regions in the semiconductor membrane to define channels beneath the transistor gates within the localized strained region of the semiconductor membrane.

29. The structure of claim 28, wherein the recesses in the wafer are shaped to induce a mechanical strain in the silicon film that is greater than approximately 0.5%.

30. The structure of claim 28, wherein the recesses in the wafer are shaped to induce a mechanical strain in the silicon film that is within a range of approximately 0.75% and 1.5%.

31. The structure of claim 28, wherein the recesses are formed by a Local Oxidation of Silicon (LOCOS) process.

32. A semiconductor structure, comprising:
a silicon with a number of recesses such that the wafer has a number of raised areas and a number of recessed areas;
a silicon membrane bonded to the raised and recessed areas of the wafer, wherein the membrane has a thickness less than 2000 Å, the wafer is mechanically strained when bonded in the recessed areas such that the membrane has localized strained regions with a strain greater than 0.5%.
a number of gates positioned over the semiconductor membrane, each gate positioned over a localized strained region of the semiconductor membrane with a gate dielectric positioned between the gate and the membrane; and
diffusion regions in the semiconductor membrane to define channels beneath the transistor gates within the localized strained region of the semiconductor membrane.

33. The structure of claim 32, wherein the localized strained regions have a strain within a range of approximately 0.75% to 1.5%.

34. The structure of claim 32, wherein the membrane has a thickness less than 1000 Å.

35. The structure of claim 32, wherein the membrane has a thickness within a range of approximately 300 Å to 1000 Å, and the localized strained regions have a strain within a range of approximately 0.75% to 1.5%.

36. The structure of claim 32, wherein the recessed areas of the membrane have a length of approximately 1000 Å and a depth of approximately 150 Å.

37. The structure of claim 32, wherein the diffusion regions diffuse into the semiconductor membrane from impurities implanted into the wafer when the wafer and the membrane are heated.

* * * * *

UNITED STATES PATENT AND TRADEMARK OFFICE
CERTIFICATE OF CORRECTION

PATENT NO.       : 7,045,874 B2
APPLICATION NO.  : 10/931580
DATED            : May 16, 2006
INVENTOR(S)      : Forbes It is certified that error appears in the above-identified patent and that said Letters Patent is hereby corrected as shown below:

On the face page, in field (73), in "Assignee", in column 1, lines 1-2, after "ID (US)" insert - - 83707 - -.

On the face page, in field (74), in "Attorney, Agent, or Firm", in column 2, line 1, delete "Schwegmen," and insert - - Schwegman, - -, therefor.

On page 2, in field (56), under "Other Publications", in column 2, line 6, delete "Meeting," and insert - - Meeting. - -, therefor.

On page 2, in field (56), under "Other Publications", in column 2, line 15, delete "DRC," and insert - - DRC. - -, therefor.

On page 2, in field (56), under "Other Publications", in column 2, line 51, delete "SiO2" and insert - - $SiO_2$ - -, therefor.

On page 3, in field (56), under "Other Publications", in column 1, lines 23-24, delete "on, Jun. 14-16, 1999, 29-30." and insert - - on Jun. 14-16, 1999, (Jun. 1999), 29-30. - -, therefor.

On page 3, in field (56), under "Other Publications", in column 1, line 34, below "78-80." insert - - LOO, Y L., et al., "Contact Printing With Nanometer Resolution", Device Research Conference, (June 2002), 14-150. - -.

On page 3, in field (56), under "Other Publications", in column 1, line 35, delete "D,," and insert - - D., - -, therefor.

On page 3, in field (56), under "Other Publications", in column 1, line 53, delete "Barbara, Jun. 2002, Abstract, pp. 8-9." and insert - - Barbara, Jun. 2002, Abstract, (Jun. 2002), pp. 8-9. - -, therefor.

On page 3, in field (56), under "Other Publications", in column 1, line 56, delete "third" and insert - - Third - -, therefor.

On page 3, in field (56), under "Other Publications", in column 1, line 57, after "(1995)" insert - - , - -.

On page 3, in field (56), under "Other Publications", in column 1, line 59, delete "Quantum-well" and insert -- quantum-well - -, therefor.

UNITED STATES PATENT AND TRADEMARK OFFICE
CERTIFICATE OF CORRECTION

PATENT NO. : 7,045,874 B2
APPLICATION NO. : 10/931580
DATED : May 16, 2006
INVENTOR(S) : Forbes It is certified that error appears in the above-identified patent and that said Letters Patent is hereby corrected as shown below:

On page 3, in field (56), under "Other Publications", in column 1, line 62, delete "(inteface)" and insert - - (interface) - -, therefor.

On page 3, in field (56), under "Other Publications", in column 2, lines 8-9, delete "/report100/" and insert - - /report00/ - -, therefor.

On page 3, in field (56), under "Other Publications", in column 2, line 13, delete "Si-xGex" and insert - - $Si_{1-x}Ge_x$ - -, therefor.

On page 3, in field (56), under "Other Publications", in column 2, line 17, delete "GexSi1-x/Si" and insert - - $Ge_xSi_{1-x}/Si$ - -, therefor.

On page 3, in field (56), under "Other Publications", in column 2, line 21, delete "n-MOSFET's" and insert - - n-MOSFETs - -, therefor.

On page 3, in field (56), under "Other Publications", in column 2, line 34, delete "SiO2"," and insert - - $SiO_2$", - -, therefor.

On page 3, in field (56), under "Other Publications", in column 2, line 41, delete "Vandebroek,," and insert - - Vandebroek, - -, therefor.

On page 3, in field (56), under "Other Publications", in column 2, line 57, delete "DRC," and insert - - DRC. - -, therefor.

On page 3, in field (56), under "Other Publications", in column 2, line 59, delete "Si1-xGex" and insert - - $Si_{1-x}Ge_x$ - -, therefor.

On page 3, in field (56), under "Other Publications", in column 2, line 60, delete "Complaint" and insert - - Compliant - -, therefor.

On page 3, in field (56), under "Other Publications", in column 2, lines 61-62, delete "Barbara, Jun. 2002, 8." and insert - - Barbara, Jun. 2002, (Jun. 2002), 8. - -, therefor.

On Sheet 1 of 15, in FIG. 1 (y-axis), delete "LATITICE" and insert - - LATTICE - -, therefor.

In column 8, line 66, delete "(A strain)" and insert - - ($\Delta$ strain) - -, therefor.

UNITED STATES PATENT AND TRADEMARK OFFICE
CERTIFICATE OF CORRECTION

PATENT NO.       : 7,045,874 B2
APPLICATION NO.  : 10/931580
DATED            : May 16, 2006
INVENTOR(S)      : Forbes It is certified that error appears in the above-identified patent and that said Letters Patent is hereby corrected as shown below:

In column 16, line 31, in Claim 32, delete "0.5%." and insert - - 0.5%; - -, therefor.

Signed and Sealed this

Twenty-second Day of August, 2006

JON W. DUDAS
*Director of the United States Patent and Trademark Office*